United States Patent
Hwang et al.

(10) Patent No.: US 11,276,444 B2
(45) Date of Patent: Mar. 15, 2022

(54) MEMORY DEVICE AND OPERATING METHOD THEREOF

(71) Applicant: SK hynix Inc., Gyeonggi-do (KR)

(72) Inventors: Jin Ha Hwang, Gyeonggi-do (KR); Tai Sik Shin, Gyeonggi-do (KR); Dong Shin Jo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/321,601

(22) Filed: May 17, 2021

(65) Prior Publication Data

US 2021/0312963 A1     Oct. 7, 2021

Related U.S. Application Data

(63) Continuation-in-part of application No. 17/017,009, filed on Sep. 10, 2020.

(30) Foreign Application Priority Data

Apr. 2, 2020  (KR) .......................... 10-2020-0040184

(51) Int. Cl.
*H03K 5/24* (2006.01)
*G11C 8/06* (2006.01)
*G11C 8/18* (2006.01)

(52) U.S. Cl.
CPC . *G11C 8/06* (2013.01); *G11C 8/18* (2013.01)

(58) Field of Classification Search
CPC .... H03K 5/1565; H03K 5/2481; H03K 5/135; H03K 5/02; H03K 5/22; H03K 5/24; H03K 5/156; H03K 17/687
See application file for complete search history.

(56) References Cited

U.S. PATENT DOCUMENTS 7,190,203 B2 *  3/2007  Choi ..................... H03K 5/151
                                                            327/175

* cited by examiner

*Primary Examiner* — Sibin Chen
(74) *Attorney, Agent, or Firm* — IP & T Group LLP

(57) ABSTRACT

An electronic device is provided. A buffer circuit, performing an optimized operation according to the present disclosure, includes a pause detector, a toggle detector, and an output signal controller. The pause detector receives an input signal and generates a pause signal which indicates whether the input signal is in a pause state. The toggle detector receives the input signal and the pause signal and generates a toggle signal which indicates whether the input signal is in a toggle state. The output signal controller generates an output signal which controls input buffer circuits according to the toggle signal.

20 Claims, 20 Drawing Sheets

MEMORY DEVICE AND OPERATING METHOD THEREOF

CROSS-REFERENCE TO RELATED APPLICATION

This application is a continuation-in-part of U.S. patent application Ser. No. 17/017,009 filed on Sep. 10, 2020 which claims benefits of priority of Korean Patent Application No. 10-2020-0040184, filed on Apr. 2, 2020. The disclosure of each of the applications is incorporated herein by reference in its entirety.

BACKGROUND

Field of Invention

Various embodiments of the present disclosure generally relate to an electronic device, and more particularly, to a buffer circuit and an operating method thereof.

Description of Related Art

A storage device may store data in response to control of a host device such as a computer or a smartphone. A storage device may include a memory device storing data and a memory controller controlling the memory device. Memory devices are generally classified into volatile memory devices and nonvolatile memory devices.

Volatile memory devices may store data only when power is supplied thereto, and may lose data stored therein when supply of power thereto is blocked. Examples of volatile memory devices include Static Random Access Memory (SRAM) and Dynamic Random Access Memory (DRAM).

Nonvolatile memory devices may retain the stored data even in the absence of a power supply. Examples of nonvolatile memory devices include Read Only Memory (ROM), Programmable ROM (PROM), Electrically Programmable ROM (EPROM), Electrically Erasable and Programmable ROM (EEPROM), and flash memory.

SUMMARY

Various embodiments of the present disclosure are directed to a buffer circuit having improved reliability and a method of operating the buffer circuit.

According to an embodiment, a buffer circuit may include a pause detector and an output signal controller. The pause detector may receive an input signal and generate a pause signal which indicates whether the input signal is in a toggle state or a pause state. The output signal controller may generate an output signal based on the input signal and control a duty cycle of the output signal according to the pause signal.

According to an embodiment, a method of operating a buffer circuit may include generating a pause signal which indicates whether an input signal is in a toggle state or a pause state, outputting the pause signal as a duty control signal after the input signal is input and a set delay has passed, determining an output ratio to be a first ratio or a second ratio according to the duty control signal, and generating an output signal based on the input signal according to the output ratio.

According to an embodiment, a buffer circuit may include a detector and an output signal controller. The detector may receive an input signal and generate an indication signal indicating whether the input signal is in a pause state or a toggle state. The output signal controller may receive the input signal, generate an output signal corresponding to the input signal and control a duty cycle of the output signal according to the indication signal. The output signal may have a first duty cycle from when the input signal makes a transition from the pause state to the toggle state to a first time point in the toggle state. The output signal may have a second duty cycle less than the first duty cycle from the first time point through transition of the input signal from the toggle state back to the pause state to a second time point in the pause state. The output signal has the first duty cycle after the second time point.

According to another embodiment, a buffer circuit may include a pause detector, a toggle detector, and an output signal controller. The pause detector may receive an input signal and generate a pause signal which indicates whether the input signal is in a pause state. The toggle detector may receive the input signal and the pause signal and generate a toggle signal which indicates whether the input signal is in a toggle state. The output signal controller may generate an output signal which controls input buffer circuits according to the toggle signal.

According to another embodiment, a memory device may include input buffer circuits, a signal state detection circuit, and a control circuit. The input buffer circuits may receive a command or an address. The signal state detection circuit may receive an input signal and generate a state signal which indicates whether the input signal is in a pause state, a toggle state, or a reset state. The control circuit may generate a control signal which controls the input buffer circuits according to the state signal. The signal state detection circuit may include a pause detector, a toggle detector, and a signal state determiner. The pause detector may receive the input signal and generate a pause signal which indicates whether the input signal is in the pause state. The toggle detector may receive the input signal and the pause signal and generate a toggle signal which indicates whether the input signal is in the toggle state. The signal state determiner may determine a state of the input signal based on the pause signal and the toggle signal and generate the state signal.

DETAILED DESCRIPTION

Embodiments of the present disclosure may be implemented in various forms, and thus the invention should not be construed as limited to any of the embodiments set forth herein. Also, throughout the specification, reference to "an embodiment," "another embodiment" or the like is not necessarily to only one embodiment, and different references to any such phrase are not necessarily to the same embodiment. The term "embodiments" when used herein does not necessarily refer to all embodiments. Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s). Hereinafter, various embodiments of the present disclosure are described in detail with reference to the accompanying drawings.

Figure 1:
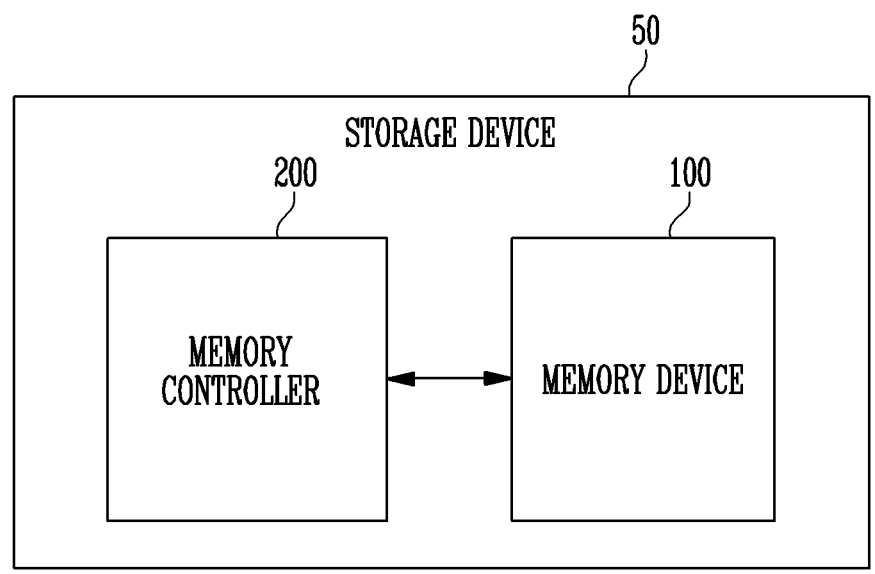
FIG. 1 is a diagram illustrating a storage device.

FIG. 1 is a diagram illustrating a storage device 50.

Referring to FIG. 1, the storage device 50 may include a memory device 100 and a memory controller 200 controlling an operation of the memory device 100. The storage device 50 may store data in response to control of a host (not shown). Examples of the host include a cellular phone, a smartphone, an MP3 player, a laptop computer, a desktop computer, a game player, a TV, a tablet PC, and an in-vehicle infotainment system.

The storage device 50 may be configured as any of various types of storage devices according to a host interface corresponding to a communication method with the host. For example, the storage device 50 may be configured as a solid state drive (SSD), a multimedia card in the form of a multimedia card (MMC), (e.g., an eMMC, an RS-MMC or a micro-MMC), a secure digital card in the form of an SD, (e.g., a mini-SD or a micro-SD), a universal serial bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, or a memory stick.

The storage device 50 may be manufactured as any of various types of packages. For example, the storage device 50 may be manufactured as a package on package (POP), a system in package (SIP), a system on chip (SOC), a multi-chip package (MCP), a chip on board (COB), a wafer-level fabricated package (WFP), or a wafer-level stack package (WSP).

The memory device 100 may store data. The memory device 100 may operate in response to control of the memory controller 200. The memory device 100 may include a memory cell array including a plurality of memory cells storing data.

Each of the memory cells may be configured as a Single-Level Cell (SLC) storing one bit of data, a Multi-Level Cell (MLC) storing two bits of data, a Triple-Level Cell (TLC) storing three bits of data, or a Quad-Level Cell (QLC) for storing four bits of data.

The memory cell array may include a plurality of memory blocks. Each of the memory blocks may include a plurality of memory cells. Each of the memory blocks may include a plurality of pages. According to an embodiment, a page may be a unit for storing data in the memory device 100 or reading data stored in the memory device 100.

The memory block may be a unit for erasing data. According to an embodiment, the memory device 100 may be any of a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR), a Rambus Dynamic Random Access Memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), or a spin-transfer torque random access memory (STT-RAM). By way of example, in the context of the following description, the memory device 100 is a NAND flash memory.

The memory device 100 may receive a command and an address from the memory controller 200, and access an area selected by the address in the memory cell array of the memory device 100. That is, the memory device 100 may perform an operation instructed by the command on the area selected by the address. For example, the memory device 100 may perform a write operation (i.e., a program operation), a read operation, or an erase operation. During the program operation, the memory device 100 may program data into the area selected by the address. During the read operation, the memory device 100 may read data from the area selected by the address. During the erase operation, the memory device 100 may erase data stored in the area selected by the address.

The memory controller 200 may control general operation of the storage device 50.

When power is supplied to the storage device 50, the memory controller 200 may execute firmware (FW). When the memory device 100 is a flash memory device, the memory controller 200 may execute firmware such as a Flash Translation Layer (FTL) for controlling communication between the host and the memory device 100.

According to an embodiment, the memory controller 200 may receive data and a Logical Block Address (LBA) from the host and translate the LBA into a Physical Block Address (PBA) indicating an address of memory cells in which data in the memory device 100 is to be stored.

The memory controller 200 may control the memory device 100 to perform a program operation, a read operation, or an erase operation in response to a request from the host. During the program operation, the memory controller 200 may provide a write command, a physical block address, and data to the memory device 100. During the read operation, the memory controller 200 may provide a read command and a physical block address to the memory device 100. During the erase operation, the memory controller 200 may provide an erase command and a physical block address to the memory device 100.

According to an embodiment, the memory controller 200 may generate and transfer a command, an address, and data to the memory device 100 in the absence of a request from the host. For example, the memory controller 200 may provide a command, an address, and data to the memory device 100 to perform background operations, such as a program operation for wear leveling and a program operation for garbage collection.

According to an embodiment, the memory controller 200 may control at least two memory devices 100. The memory controller 200 may control the memory devices 100 according to an interleaving scheme so as to improve operational performance. The interleaving scheme may be an operating scheme in which at least two memory devices 100 operate in at least partially overlapping periods.

The host may communicate with the storage device 50 using at least one of various communication methods such as a Universal Serial Bus (USB), Serial AT Attachment (SATA), Serial Attached SCSI (SAS), a High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), a MultiMedia Card (MMC) of an embedded MMC (eMMC), a Dual In-line Memory Module (DIMM), a Registered DIMM (RDIMM), and/or a Load Reduced DIMM (LRDIMM).

Figure 2:
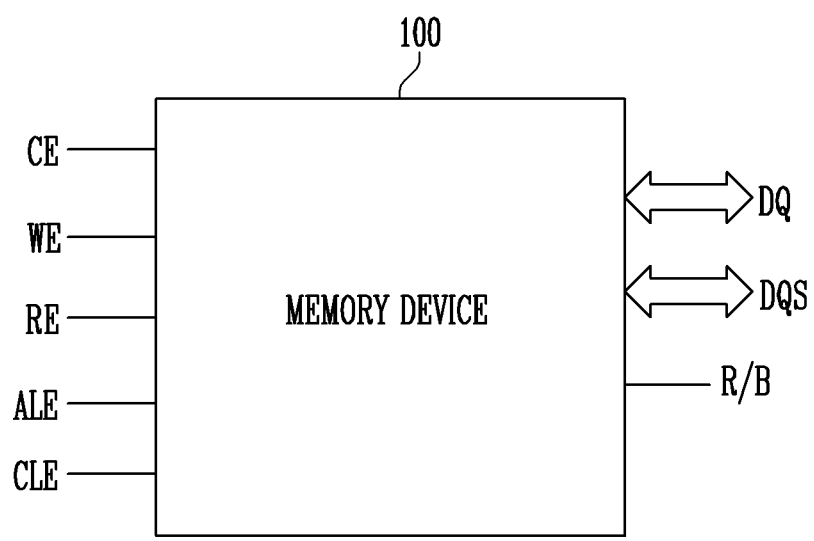
FIG. 2 is a diagram illustrating an input/output signal and an operation of a memory device, such as that shown in FIG. 1.

FIG. 2 is a diagram illustrating an input/output signal and an operation of the memory device 100 shown in FIG. 1.

Referring to FIG. 2, the memory device 100 may communicate with the memory controller 200 shown in FIG. 1 through a plurality of input/output lines.

The memory device 100 may receive a chip enable signal CE from the memory controller 200. When the memory device 100 communicating with the memory controller 200 includes a plurality of memory chips, the chip enable signal CE may be a control signal for selecting a particular memory chip among the plurality of memory chips.

The memory device 100 may receive a data strobe signal DQS from the memory controller 200. The memory device 100 may be synchronized with the data strobe signal DQS to communicate data with the memory controller 200 through data input/output lines DQ.

The memory device 100 may receive an address latch enable signal ALE from the memory controller 200. The address latch enable signal ALE may be for indicating that data input to the memory device 100 through the data input/output lines DQ is an address.

The memory device 100 may receive a command latch enable signal CLE from the memory controller 200. The command latch enable signal CLE may be for indicating that data input to the memory device 100 through the data input/output lines DQ is a command.

The memory device 100 may receive a write enable signal WE from the memory controller 200. The write enable signal WE may be for controlling latching of a command, an address, and input data that are input to the memory device 100 through the data input/output lines DQ. When the write enable signal WE is activated, the memory device 100 may store data input through the data input/output lines DQ as a command, an address, or input data.

The memory device 100 may receive a read enable signal RE from the memory controller 200. The read enable signal RE may be a control signal for enabling output of serial data. The memory device 100 may provide the memory controller 200 with data read based on the read enable signal RE.

The memory device 100 may output a ready/busy signal R/B to the memory controller 200.

The ready/busy signal R/B may be for indicating a state of the memory device 100. The ready/busy signal R/B may indicate a busy state in which the memory device 100 is currently performing at least one operation or a ready state in which the memory device 100 is not currently performing an operation and can receive a command.

Figure 3:
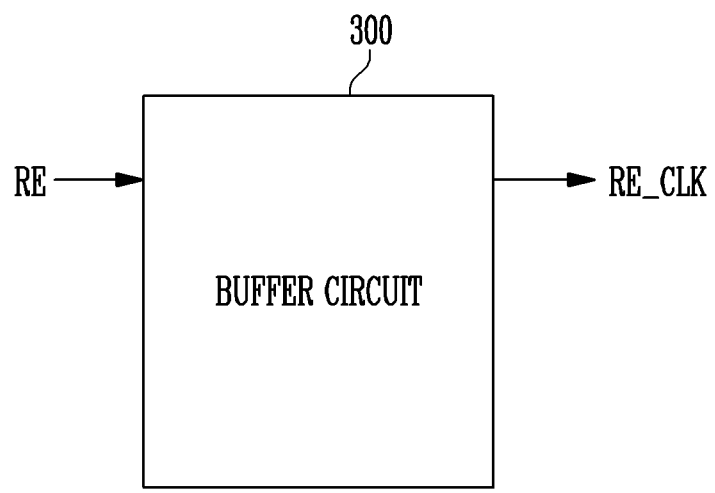
FIG. 3 is a diagram illustrating a buffer circuit according to an embodiment of the present disclosure.

FIG. 3 is a diagram illustrating a buffer circuit 300 according to an embodiment of the present disclosure.

Referring to FIG. 3, the buffer circuit 300 may be included in the memory device 100 shown in FIG. 2.

According to another embodiment, the buffer circuit 300 may be included in the storage device 50 but disposed external to the memory device 100.

The buffer circuit 300 may generate an output signal based on an input signal. According to an embodiment, the input signal may be the read enable signal RE. The output signal may be a clock signal RE_CLK. However, the input signal and the output signal are not limited to these two types of signals.

The buffer circuit 300 may generate the clock signal RE_CLK based on the read enable signal RE received from the memory controller 200. The memory device 100 may synchronize with the clock signal RE_CLK generated by the buffer circuit 300 to perform the read operation.

Figure 4:
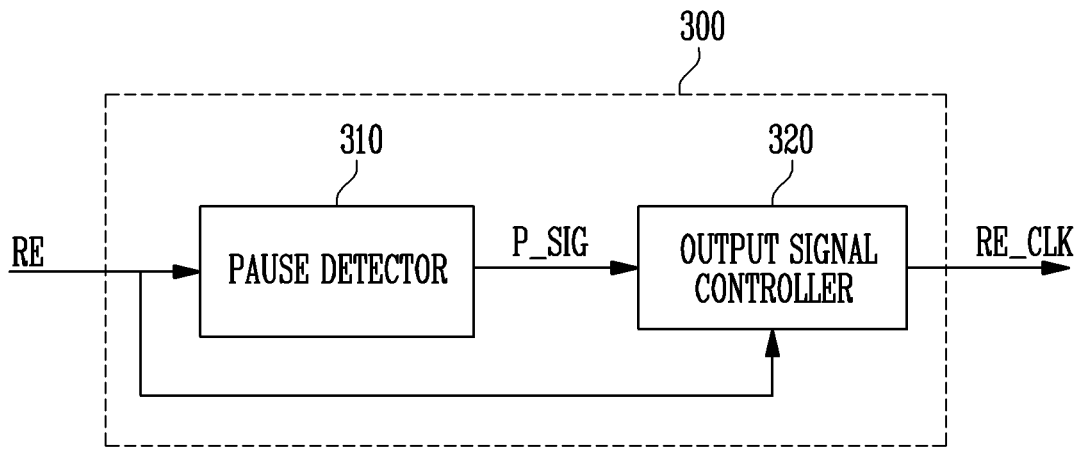
FIG. 4 is a diagram illustrating a structure and an operation of a buffer circuit, such as that shown in FIG. 3.

FIG. 4 is a diagram illustrating a structure and an operation of the buffer circuit 300 shown in FIG. 3.

Referring to FIG. 4, the buffer circuit 300 may include a pause detector 310 and an output signal controller 320.

In FIG. 4, an input signal may be the read enable signal RE and an output signal may be the clock signal RE_CLK. However, the input signal and the output signal are not limited to these two types of signals.

The pause detector 310 may generate a pause signal P_SIG for indicating whether the input signal, e.g., the read enable signal RE, is in a toggle state Toggling or a pause state Pause. For example, when the pause signal P_SIG has a logic high level, the input signal RE may be in the pause state Pause. When the pause signal P_SIG has a logic low level, the input signal RE may be in the toggle state Toggling. In another example, when the pause signal P_SIG has a logic low level, the input signal RE may be in the pause state Pause. When the pause signal P_SIG has a logic high level, the input signal RE may be in the toggle state Toggling.

A configuration and an operation of the pause detector 310 are described below with reference to FIGS. 5 and 6.

The output signal controller 320 may generate the output signal, e.g., the clock signal RE_CLK, based on the input signal RE. The output signal controller 320 may control a duty cycle of the output signal RE_CLK in response to the pause signal P_SIG. The duty cycle may refer to a ratio of an activated period to an entire cycle of the output signal RE_CLK.

The output signal controller 320 may adjust a duty cycle by controlling an output PN ratio in the output signal controller 320 according to the pause signal P_SIG. The output PN ratio may refer to a size ratio of an activated pull-up device, e.g., PMOS transistor(s), to an activated pull-down device, e.g., NMOS transistor(s), among pull-up devices and pull-down devices in the output signal controller 320. A configuration and an operation of the output signal controller 320 are described below with reference to FIGS. 8 to 10.

Figure 5:
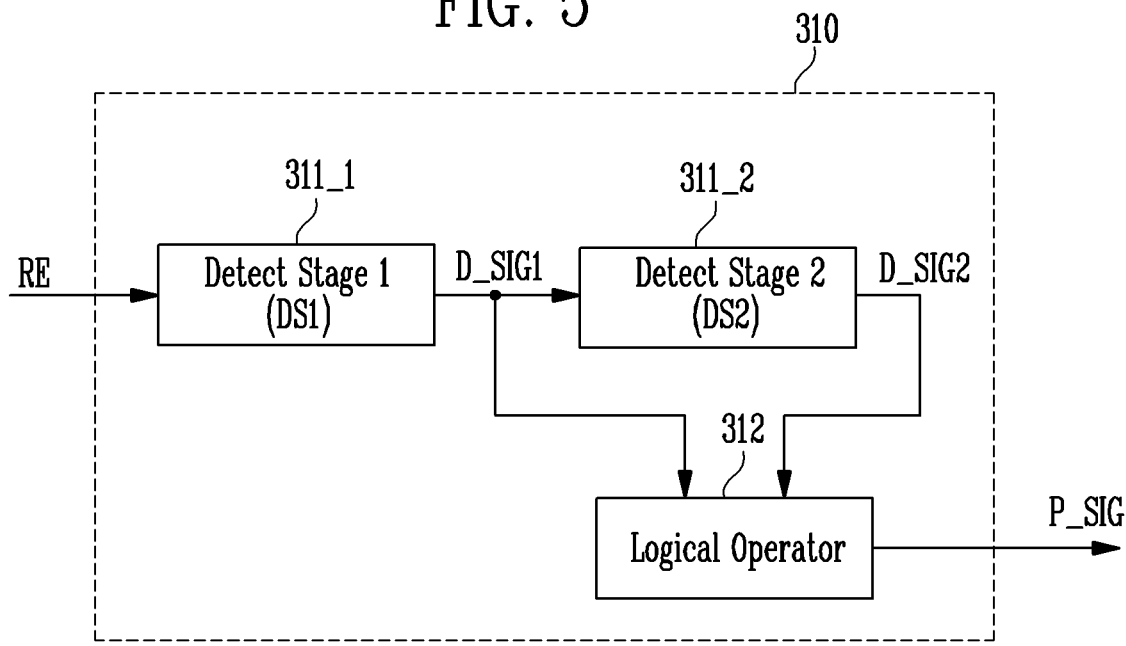
FIG. 5 is a diagram illustrating a configuration and an operation of a pause detector, such as that shown in FIG. 4.

FIG. 5 is a diagram illustrating a configuration and an operation of the pause detector 310 shown in FIG. 4.

Referring to FIG. 5, the pause detector 310 may include a first detect stage 311_1, a second detect stage 311_2, and a logical operator 312. According to an embodiment, the pause detector 310 may include an input signal receive stage (not illustrated). The input signal receive stage may receive the input signal RE input from an external device (e.g., the memory controller 200) and may transfer the received input signal RE to the first detect stage 311_1.

The first detect stage 311_1 may generate a first detection signal D_SIG1 based on the input signal RE. The first detect stage 311_1 may generate the first detection signal D_SIG1 by biasing the input signal RE with a set pulse, e.g., an up pulse or a down pulse.

According to an embodiment, the first detect stage 311_1 may generate the first detection signal D_SIG1 by biasing the toggling input signal RE with an up pulse. When the first detect stage 311_1 biases the input signal RE with an up pulse and the input signal RE is the up pulse, the first detect stage 311_1 may increase output of the first detection signal D_SIG1 to a high level. When the first detect stage 311_1 biases the input signal RE with the up pulse and the input signal RE is the down pulse, the first detect stage 311_1 may control the output of the first detection signal D_SIG1 to be slightly less than the high level.

According to another embodiment, the first detect stage 311_1 may generate the first detection signal D_SIG1 by biasing the toggling input signal RE with a down pulse. When the first detect stage 311_1 biases the input signal RE with a down pulse and the input signal RE is the down pulse, the first detect stage 311_1 may decrease output of the first detection signal D_SIG1 to a low level. When the first detect stage 311_1 biases the input signal RE with the down pulse and the input signal RE is the up pulse, the first detect stage 311_1 may control the output of the first detection signal D_SIG1 to be slightly greater than the low level.

The second detect stage 311_2 may generate a second detection signal D_SIG2 based on the first detection signal D_SIG1. As described above, the second detect stage 311_2 may generate the second detection signal D_SIG2 by biasing the first detection signal D_SIG1 with a set pulse, e.g., an up pulse or a down pulse.

The first detection signal D_SIG1 may be generated by biasing the toggling input signal RE with the set pulse. The first detection signal D_SIG1 may have a greater output ratio of the set pulse than the input signal RE when the input signal RE is toggling.

The second detection signal D_SIG2 may be generated by biasing the toggling first signal D_SIG1 with the set pulse. The second detection signal D_SIG2 may be generated by biasing the toggling input signal RE with the set pulse twice. The second detection signal D_SIG2 may have a greater output ratio of the set pulse than the first detection signal D_SIG1 when the input signal RE is toggling.

As described above, when the number of times the input signal RE is biased with a set pulse increases, an output ratio of the set pulse of a detection signal at a period during which the input signal RE is toggling may increase.

The logical operator 312 may perform a logical operation on the first detection signal D_SIG1 and the second detection signal D_SIG2 to generate the pause signal P_SIG. The pause signal P_SIG that has a set pulse level when the input signal RE is toggling may be generated by the logical operation on the first detection signal D_SIG1 and the second detection signal D_SIG2. According to an embodiment, the logical operation may include an OR operation or a NOR operation.

The pause signal P_SIG may have different logic levels depending on whether the input signal RE is in the toggle state Toggling or the pause state Pause.

For example, when the input signal RE is in the pause state Pause, the pause signal P_SIG may have a logic high level and when the input signal RE is in the toggle state Toggling, the pause signal P_SIG may have a logic low level. In another example, when the input signal RE is in the pause state Pause, the pause signal P_SIG may have a logic low level and when the input signal RE is in the toggle state Toggling, the pause signal P_SIG may have a logic high level.

According to various embodiments, the pause detector 310 may include only the first detect stage 311_1. In such embodiments, the pause detector 310 may directly output the first detection signal D_SIG1 as the pause signal P_SIG. Accuracy of detection, in which the pause detector 310 detects whether the input signal RE is in the toggle state Toggling, may be decreased, but the pause detector 310 may detect whether the input signal RE is in the toggle state Toggling using less components. In addition, a circuit delay between the reception of the input signal RE and the output of the pause signal P_SIG may be decreased.

According to various embodiments, the pause detector 310 may include at least two detect stages. At least two detect stages may be coupled by a cascade method. Detection signals respectively output from at least two detect stages may be input to the logical operator 312. When the number of detect stages increases, accuracy indicating whether the pause signal P_SIG is in the toggle state Toggling or the pause state Pause may increase.

Figure 6:
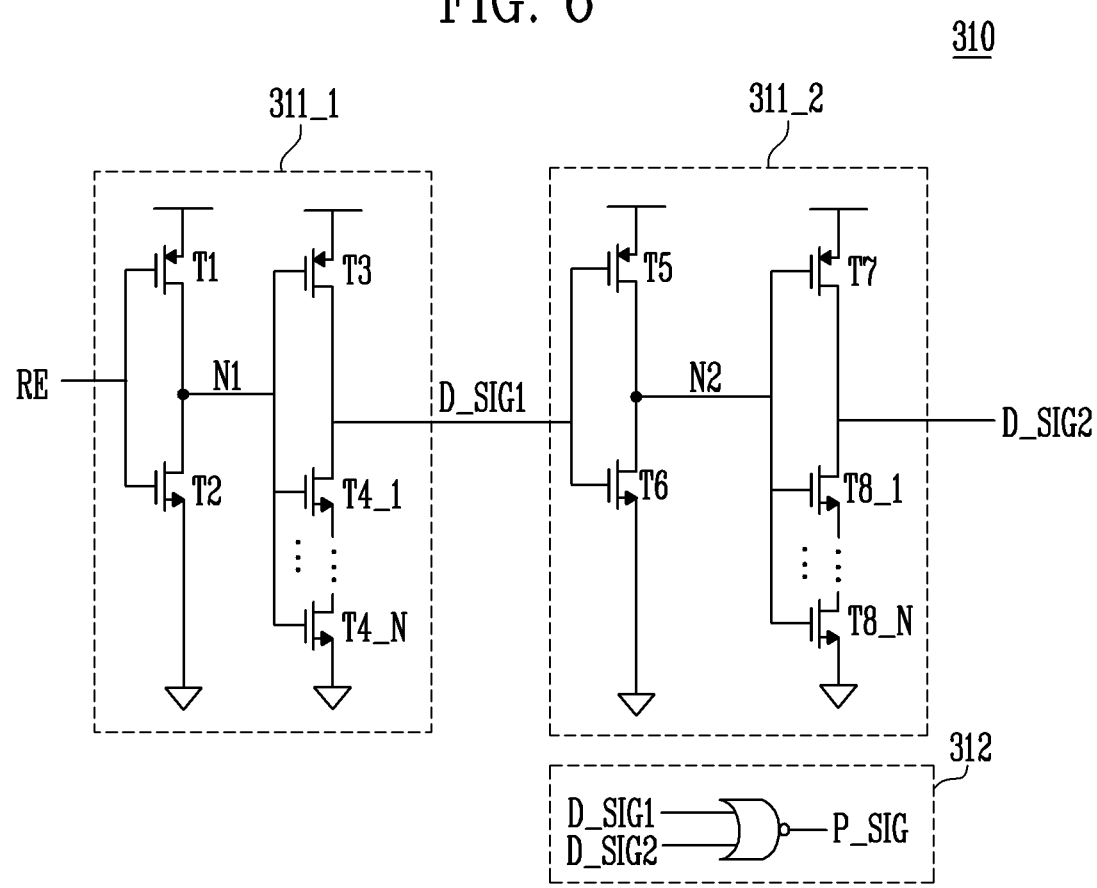
FIG. 6 is a detailed diagram illustrating a configuration of a pause detector, such as that shown in FIG. 5.

FIG. 6 is a detailed diagram illustrating a configuration of the pause detector 310 shown in FIG. 5.

Referring to FIG. 6, the first detect stage 311_1 may generate the first detection signal D_SIG1 by biasing the input signal RE with an up pulse.

The first detect stage 311_1 may include first, second, and third transistors T1, T2, and T3 and at least one fourth transistor T4_1 to T4_N, where N is a natural number of 1 or more.

The first transistor T1 may be a PMOS transistor and the second transistor T2 may be an NMOS transistor. The first and second transistors T1 and T2 may operate as a CMOS inverter between a node to which the input signal RE is input and a first node N1. The input signal RE may be inverted to be output to the first node N1.

The third transistor T3 may be a PMOS transistor and at least one fourth transistor T4_1 to T4_N may be an NMOS transistor. At least one fourth transistor T4_1 to T4_N each may be coupled by various methods. For example, at least one fourth transistor T4_1 to T4_N may be coupled in series, in parallel as shown in FIG. 6, or by any suitable combination thereof.

The third transistor T3 and at least one fourth transistor T4_1 to T4_N may operate as a CMOS inverter between the first node N1 and a node from which the first detection signal D_SIG1 is output. An input signal of the first node N1 may be inverted to be output as the first detection signal D_SIG1.

The third transistor T3 may be pull-up driven with respect to the input signal of the first node N1. At least one fourth transistor T4_1 to T4_N may be pull-down driven with respect to the input signal of the first node N1.

According to an embodiment, the first detect stage 311_1 may be designed such that a pull-up driving power is greater than a pull-down driving power with respect to the input signal of the first node N1.

More specifically, the first detect stage 311_1 may be designed such that impedance of a pull-down stage between the first node N1 and a ground voltage stage is greater than impedance of a pull-up stage between the first node N1 and a power stage. Impedance of at least one fourth transistor T4_1 to T4_N in the pull-down stage between the first node N1 and the ground voltage stage may be greater than impedance of the third transistor T3 in the pull-up stage between the first node N1 and the power stage. According to this embodiment, the input signal RE may be biased with an up pulse and may be output as the first detection signal D_SIG1.

The second detect stage 311_2 may generate the second detection signal D_SIG2 by biasing the first detection signal D_SIG1 with the up pulse.

The second detect stage 311_2 may include fifth, sixth, and seventh transistors T5, T6, and T7 and at least one eighth transistor T8_1 to T8_N, where N is a natural number of 1 or more.

The fifth transistor T5 may be a PMOS transistor and the sixth transistor T6 may be an NMOS transistor. The fifth and sixth transistors T5 and T6 may operate as a CMOS inverter between a node to which the first detection signal D_SIG1 is input and a second node N2. The first detection signal D_SIG1 may be inverted to be output to the second node N2.

The seventh transistor T7 may be a PMOS transistor and at least one eighth transistor T8_1 to T8_N may be an NMOS transistor. At least one eighth transistor T8_1 to T8_N each may be coupled by various methods. For example, at least one eighth transistor T8_1 to T8_N may be coupled in series, in parallel as shown in FIG. 6, or by any suitable combination thereof.

The seventh transistor T7 and at least one eighth transistor T8_1 to T8_N may operate as a CMOS inverter between the second node N2 and a node from which the second detection signal D_SIG2 is output. An input signal of the second node N2 may be inverted to be output as the second detection signal D_SIG2.

The seventh transistor T7 may be pull-up driven with respect to the input signal of the second node N2. At least one eighth transistor T8_1 to T8_N may be pull-down driven with respect to the input signal of the second node N2.

According to an embodiment, the second detect stage 311_2 may be designed such that a pull-up driving power is greater than a pull-down driving power with respect to the input signal of the second node N2.

More specifically, the second detect stage 311_2 may be designed such that impedance of a pull-down stage between the second node N2 and a ground voltage stage is greater than impedance of a pull-up stage between the second node N2 and a power stage. Impedance of at least one eighth transistor T8_1 to T8_N in the pull-down stage between the second node N2 and the ground voltage stage may be greater than impedance of the seventh transistor T7 in the pull-up stage between the second node N2 and the power stage. According to this embodiment, the first detection signal D_SIG1 may be biased with an up pulse and may be output as the second detection signal D_SIG2.

According to another embodiment, the first detect stage 311_1 may generate the first detection signal D_SIG1 by biasing the input signal RE with a down pulse. The first detect stage 311_1 may be designed such that a pull-down driving power is greater than a pull-up driving power with respect to the input signal of the first node N1. The first detect stage 311_1 may be designed such that impedance of a pull-up stage between the first node N1 and the power stage is greater than impedance of a pull-down stage between the first node N1 and the ground voltage stage.

The second detect stage 311_2 may generate the second detection signal D_SIG2 by biasing the first detection signal D_SIG1 with the down pulse. The second detect stage 311_2 may be designed such that a pull-down driving power is greater than a pull-up driving power with respect to the input signal of the second node N2. The second detect stage 311_2 may be designed such that impedance of a pull-up stage between the second node N2 and the power stage is greater than impedance of a pull-down stage between the second node N2 and the ground voltage stage.

According to an embodiment, the logical operator 312 may perform a logical operation on the first detection signal D_SIG1 and the second detection signal D_SIG2 to generate the pause signal P_SIG. The logical operation may include an OR operation or a NOR operation.

Figure 7:
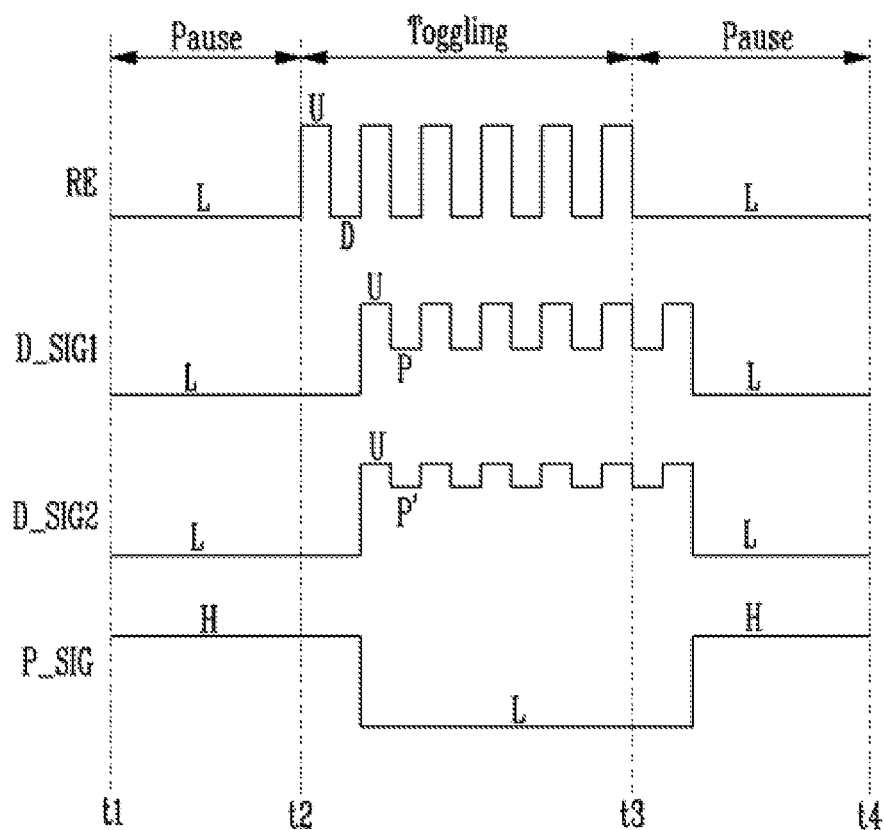
FIG. 7 is a waveform diagram of signals of a pause detector, such as that shown in FIG. 5.

FIG. 7 is a waveform diagram of signals of the pause detector 310 shown in FIG. 5.

Referring to FIG. 7, the input signal RE may have a logic low level L in the pause state Pause. The input signal RE may have an up pulse U and a down pulse D that are repeated during one cycle in the toggle state Toggling.

The first detection signal D_SIG1 may be generated by biasing the input signal RE with the up pulse U. The first detection signal D_SIG1 may be output to have the logic low level L when the input signal RE is in the pause state Pause. The first detection signal D_SIG1 may be output as the up pulse U or a pulse P when the input signal RE is in the toggle state Toggling.

More specifically, the first detection signal D_SIG1 may be output as the up pulse U when the input signal RE is in the toggle state Toggling and is the up pulse U. The first detection signal D_SIG1 may be output as the pulse P when the input signal RE is in the toggle state Toggling and is the down pulse D.

Output of the first detection signal D_SIG1 may increase to a high level and the first detection signal D_SIG1 may be output as the up pulse U when the input signal RE is the up pulse U. The output of the first detection signal D_SIG1 may decrease from the high level when the input signal RE is the down pulse D. Decrease in output of the first detection signal D_SIG1 may be less than decrease in output of the input signal RE and the first detection signal D_SIG1 may be output as the pulse P when the input signal RE is the down pulse D.

The first detection signal D_SIG1 may have the logic low level L in the pause state Pause. The first detection signal D_SIG1 may have the up pulse U and the pulse P that are repeated during one cycle in the toggle state Toggling.

The second detection signal D_SIG2 may be generated by biasing the first detection signal D_SIG1 with the up pulse U. The second detection signal D_SIG2 may be output to have the logic low level L when the first detection signal D_SIG1 is in the pause state Pause. The second detection signal D_SIG2 may be output as the up pulse U or a pulse P' when the first detection signal D_SIG1 is in the toggle state Toggling.

More specifically, the second detection signal D_SIG2 may be output as the up pulse U when the first detection signal D_SIG1 is in the toggle state Toggling and is the up pulse U. The second detection signal D_SIG2 may be output as the pulse P' when the first detection signal D_SIG1 is in the toggle state Toggling and is the pulse P.

Output of the second detection signal D_SIG2 may increase to a high level and the second detection signal D_SIG2 may be output as the up pulse U when the first signal D_SIG1 has the up pulse U. The output of the second detection signal D_SIG2 may decrease from the high level when the first detection signal D_SIG1 has the pulse P. Decrease in output of the second detection signal D_SIG2 may be less than decrease in output of the first detection signal D_SIG1 and the second detection signal D_SIG2 may be output as the pulse P' when the first signal D_SIG1 is the pulse P.

When the input signal RE changes from the pause state Pause to the toggling state Toggling, the outputs of the first detection signal D_SIG1 and the second detection signal D_SIG2 may be delayed.

When the input signal RE changes from the toggling state Toggling to the pause state Pause, the outputs of the first detection signal D_SIG1 and the second detection signal D_SIG2 may be delayed.

In the illustrated example of FIG. 7, the pause signal P_SIG may be generated by performing a NOR operation on the first detection signal D_SIG1 and the second detection signal D_SIG2. The pause signal P_SIG may be output to have a logic high level H when the input signal RE is in the pause state Pause. The pause signal P_SIG may be output to have the logic low level L when the input signal RE is in the toggle state Toggling.

According to another embodiment, the pause signal P_SIG may be generated by performing an OR operation on the first detection signal D_SIG1 and the second detection signal D_SIG2. The pause signal P_SIG may be output to have the logic low level L when the input signal RE is in the pause state Pause. The pause signal P_SIG may be output as the logic high level H when the input signal RE is in the toggle state Toggling.

Figure 8:
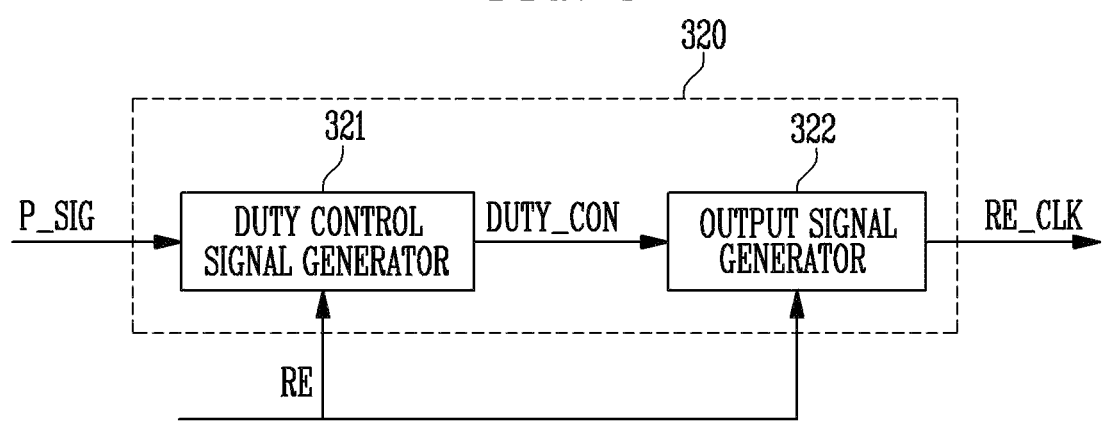
FIG. 8 is a diagram illustrating a configuration and an operation of an output signal controller, such as that shown in FIG. 4.

FIG. 8 is a diagram illustrating a configuration and an operation of the output signal controller 320 shown in FIG. 4.

Referring to FIG. 8, the output signal controller 320 may include a duty control signal generator 321 and an output signal generator 322.

According to an embodiment, the duty control signal generator 321 may output the pause signal P_SIG as a duty control signal DUTY_CON after the pause signal P_SIG is input and a target delay has passed. The target delay may be an asynchronous delay or a synchronous delay.

According to an embodiment, when the target delay is a synchronous delay, the duty control signal generator 321 may include a delay circuit which delays the input pause signal P_SIG as a set time period and then outputs the delayed pause signal P_SIG as the duty control signal DUTY_CON. The delay circuit may have any of various forms.

According to an embodiment, the output signal generator 322 may control an output PN ratio according to the duty control signal DUTY_CON and generate the output signal RE_CLK by adjusting a duty cycle of the output signal RE_CLK according to the output PN ratio.

Figure 9:
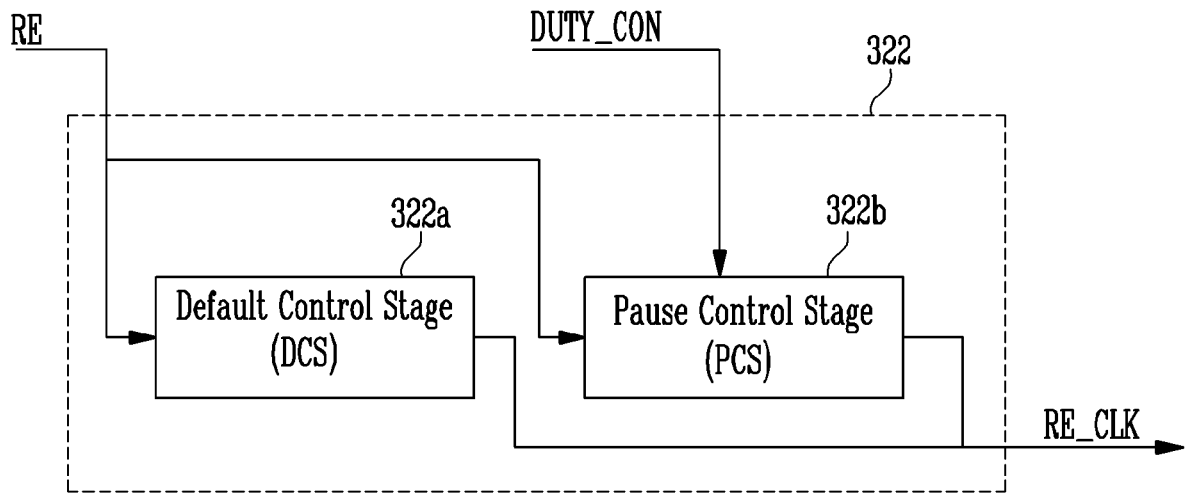
FIG. 9 is a diagram illustrating a configuration and an operation of an output signal generator, such as that shown in FIG. 8.

FIG. 9 is a diagram illustrating a configuration and an operation of the output signal generator 322 shown in FIG. 8.

Referring to FIG. 9, the output signal generator 322 may generate the output signal RE_CLK based on the input signal RE. The output signal generator 322 may control a duty cycle of the output signal RE_CLK in response to the duty control signal DUTY_CON. The duty cycle of the output signal RE_CLK may refer to a ratio of an activated period to an entire cycle of the output signal RE_CLK.

The output signal generator 322 may adjust a duty cycle by controlling an output PN ratio in the output signal generator 322 according to the duty control signal DUTY_CON. The output PN ratio may refer to a size ratio of an activated pull-up device to an activated pull-down device among pull-up devices and pull-down devices in the output signal generator 322.

The output signal generator 322 may include a default control stage (DCS) 322a and a pause control stage (PCS) 322b.

The default control stage 322a and the pause control stage 322b may be coupled in parallel between a node to which the input signal RE is input and a node from which the output signal RE_CLK is output. According to various embodiments, the output signal generator 322 may include at least one control stage.

The default control stage 322a may have a default PN ratio. The default PN ratio may refer to a size ratio of an activated pull-up device to an activated pull-down device among pull-up devices and pull-down devices in the default control stage 322a.

The pause control stage 322b may have a first control PN ratio. The first control PN ratio may refer to a size ratio of an activated pull-up device to an activated pull-down device among pull-up devices and pull-down devices in the pause control stage 322b.

At least one of the default control stage 322a and the pause control stage 322b may be selectively activated according to the duty control signal DUTY_CON. According to an embodiment, the duty control signal DUTY_CON may be selectively applied to the default control stage 322a or the pause control stage 322b through a multiplexer (MUX) circuit. The pause control stage 322b may be activated in response to the duty control signal DUTY_CON. For example, the pause control stage 322b may be activated when the duty control signal DUTY_CON has a logic high level and may be inactivated when the duty control signal DUTY_CON has a logic low level. Alternatively, according to various embodiments, the pause control stage 322b may be activated or inactivated in a converse manner. In other words, the pause control stage 322b may be activated when the duty control signal DUTY_CON has the logic low level and may be inactivated when the duty control signal DUTY_CON has the logic high level.

Accordingly, when the duty control signal DUTY_CON has a logic low level, an output PN ratio may be determined based on a default PN ratio. When the duty control signal DUTY_CON has a logic high level, the output PN ratio may be determined based on the default PN ratio and a first control PN ratio. According to an embodiment, an output PN ratio may be greater when the duty control signal DUTY_CON has a logic high level than when the duty control signal DUTY_CON has a logic low level.

Figure 10:
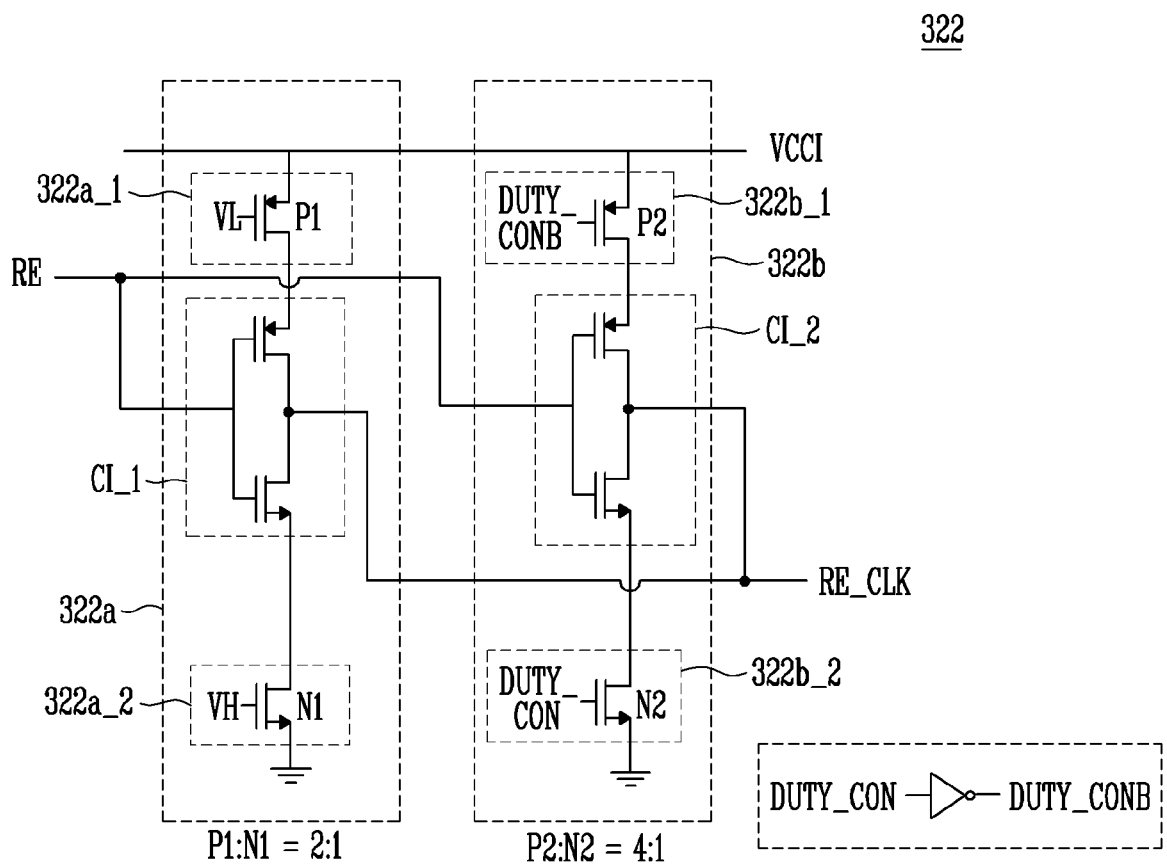
FIG. 10 is a detailed diagram illustrating a configuration of an output signal generator, such as that shown in FIG. 9.

FIG. 10 is a detailed diagram illustrating a configuration of the output signal generator 322 shown in FIG. 9.

Referring to FIG. 10, the output signal generator 322 may include the default control stage 322a and the pause control stage 322b.

The default control stage 322a may include a first pull-up stage 322a_1, a first CMOS inverter CI_1, and a first pull-down stage 322a_2.

The first pull-up stage 322a_1 may be coupled between a power voltage VCCI stage and the first CMOS inverter CI_1. The first pull-up stage 322a_1 may include a first PMOS transistor P1. A turn-on voltage VL to turn on the first PMOS transistor P1 may be applied to a gate of the first PMOS transistor P1.

The first CMOS inverter CI_1 may be coupled between a node of the input signal RE and a node of the output signal RE_CLK.

The first pull-down stage 322a_2 may be coupled between a ground voltage stage and the first CMOS inverter CI_1. The first pull-down stage 322a_2 may include a first NMOS transistor N1. A turn-on voltage VH to turn on the first NMOS transistor N1 may be applied to a gate of the first NMOS transistor N1.

At least one of the default control stage 322a and the pause control stage 322b may be selectively activated according to the duty control signal DUTY_CON. A default PN ratio of the default control stage 322a may refer to a size ratio of the first PMOS transistor P1 to the first NMOS transistor N1. By way of example, in the context of the following description, a default PN ratio is 2:1.

The pause control stage 322b may include a second pull-up stage 322b_1, a second CMOS inverter CI_2, and a second pull-down stage 322b_2.

The second pull-up stage 322b_1 may be coupled between the power voltage VCCI stage and the second CMOS inverter CI_2. The second pull-up stage 322b_1 may include a second PMOS transistor P2. An inverted duty control signal DUTY_CONB may be applied to a gate of the second PMOS transistor P2.

The second CMOS inverter CI_2 may be coupled between the node of the input signal RE and the node of the output signal RE_CLK.

The second pull-down stage 322b_2 may be coupled between a ground voltage stage and the second CMOS inverter CI_2. The second pull-down stage 322b_2 may include a second NMOS transistor N2. The duty control signal DUTY_CON may be applied to a gate of the second NMOS transistor N2.

The pause control stage 322b may be activated in response to the duty control signal DUTY_CON. A first control PN ratio of the pause control stage 322b may refer to a size ratio of the second PMOS transistor P2 to the second NMOS transistor N2. By way of example, in the context of the following description, a first control PN ratio is 4:1.

According to an embodiment, the output signal generator 322 may control an output PN ratio according to the duty control signal DUTY_CON.

For example, when the duty control signal DUTY_CON has a logic low level, the pause control stage 322b may be inactivated. According to this example, an output PN ratio may be determined to be 2:1, that is, the default PN ratio.

In another example, when the duty control signal DUTY_CON has a logic high level, the pause control stage 322b may be activated. According to this example, an output PN ratio may be determined to be (2+4):(1+1)=3:1 according to the default PN ratio and the first control PN ratio.

According to an embodiment, both the second pull-up stage 322b_1 and the second pull-down stage 322b_2 of the pause control stage 322b may be activated according to the duty control signal DUTY_CON. The inverted duty control signal DUTY_CONB may be applied to a gate of the second PMOS transistor P2 of the second pull-up stage 322b_1. The pause signal P_SIG may be applied to a gate of the second NMOS transistor N2 of the second pull-down stage 322b_2. An output PN ratio may be determined to be (2+4):(1+1)=3:1.

According to various embodiments, one of the second pull-up stage 322b_1 and the second pull-down stage 322b_2 of the pause control stage 322b may be selectively activated according to the duty control signal DUTY_CON.

For example, the second pull-down stage 322b_2 of the pause control stage 322b may be activated according to the duty control signal DUTY_CON. According to this example, the duty control signal DUTY_CON may be applied to each of the gate of the second PMOS transistor P2 of the second pull-up stage 322b_1 and the gate of the second NMOS transistor N2 of the second pull-down stage 322b_2. An output PN ratio may be determined to be (2+0):(1+1)=1:1.

In another example, the second pull-up stage 322b_1 of the pause control stage 322b may be activated according to the duty control signal DUTY_CON. According to this example, the inverted duty control signal DUTY_CONB may be applied to each of the gate of the second PMOS transistor P2 of the second pull-up stage 322b_1 and the gate of the second NMOS transistor N2 of the second pull-down stage 322b_2. An output PN ratio may be determined to be (2+4):(1+0)=6:1.

According to various embodiments, the output signal generator 322 may include at least one pause control stage 322b. The output signal generator 322 may variously control an output PN ratio by controlling each of the pause control stages 322b according to the duty control signal DUTY_CON.

Figure 11:
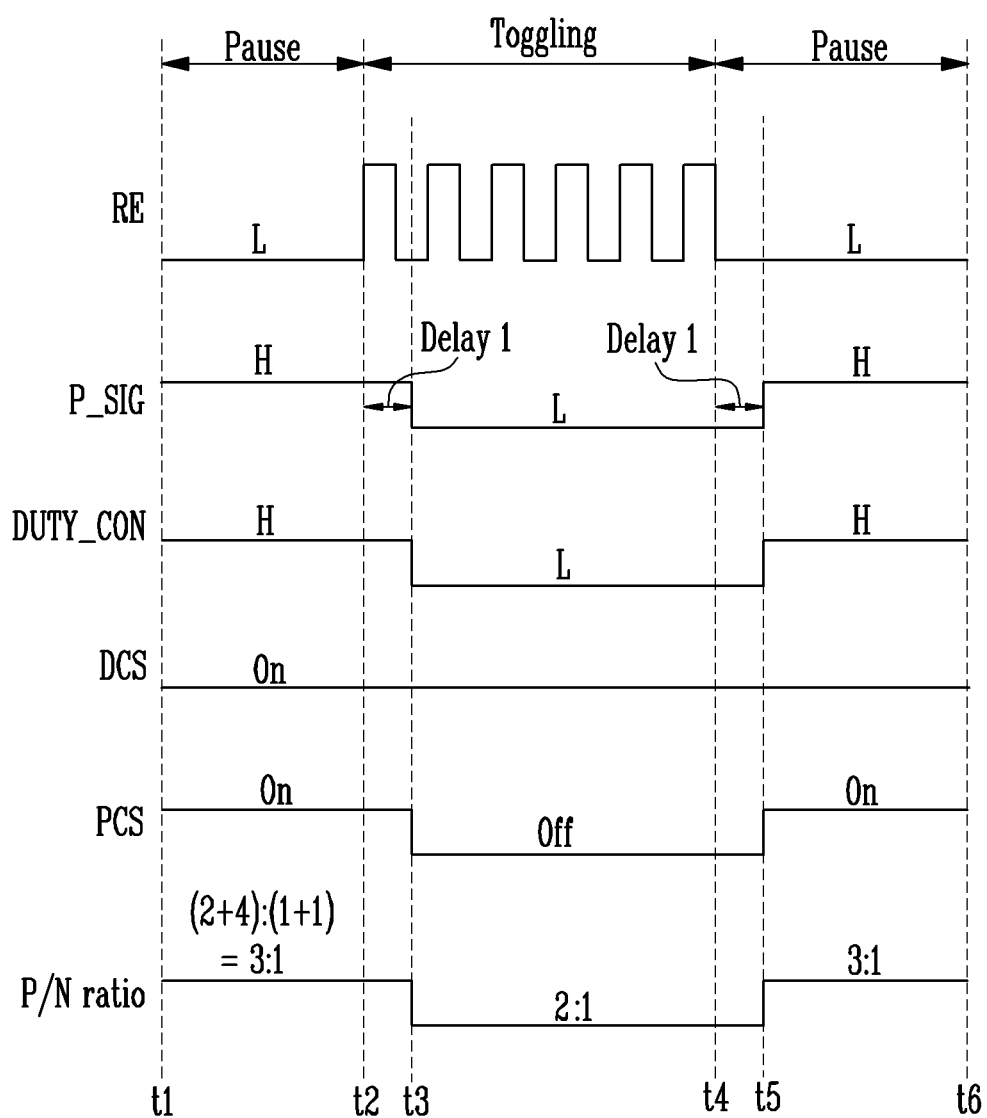
FIG. 11 is a waveform diagram illustrating an output PN ratio according to an embodiment.

FIG. 11 is a waveform diagram illustrating an output PN ratio according to an embodiment.

Referring to FIG. 11, the pause signal P_SIG may be output to have the logic high level H when the input signal RE is in the pause state Pause. The pause signal P_SIG may be output to have the logic low level L when the input signal RE is in the toggle state Toggling.

According to an embodiment, the pause signal P_SIG may be output after a first delay Delay 1 has passed from the input of the input signal RE. The first delay Delay 1 may be an asynchronous delay or a synchronous delay. The first delay Delay 1 may be variously determined according to a target output PN ratio. When the first delay Delay 1 is the asynchronous delay, the first delay Delay 1 may be determined based on an internal delay of the pause detector 310 described with reference to FIG. 4.

At least one of a default control stage DCS and a pause control stage PCS may be selectively activated according to the duty control signal DUTY_CON.

According to an embodiment, the pause control stage PCS may be activated in response to the duty control signal DUTY_CON. For example, the pause control stage PCS may be activated when the duty control signal DUTY_CON has the logic high level H (i.e., during the period from t1 to t3). The pause control stage PCS may be inactivated when the duty control signal DUTY_CON has the logic low level L (i.e., during the period from t3 to t5).

Accordingly, when the duty control signal DUTY_CON has the logic high level H, an output PN ratio (or P/N ratio) may be controlled to be 3:1 (i.e., during the period from t1 to t3). When the duty control signal DUTY_CON has the logic low level L, the output PN ratio may be controlled to be 2:1 (i.e., during the period from t3 to t5). However, the controlling of the output PN ratio according to the duty control signal DUTY_CON is not limited to the specifics of this embodiment.

Figure 12:
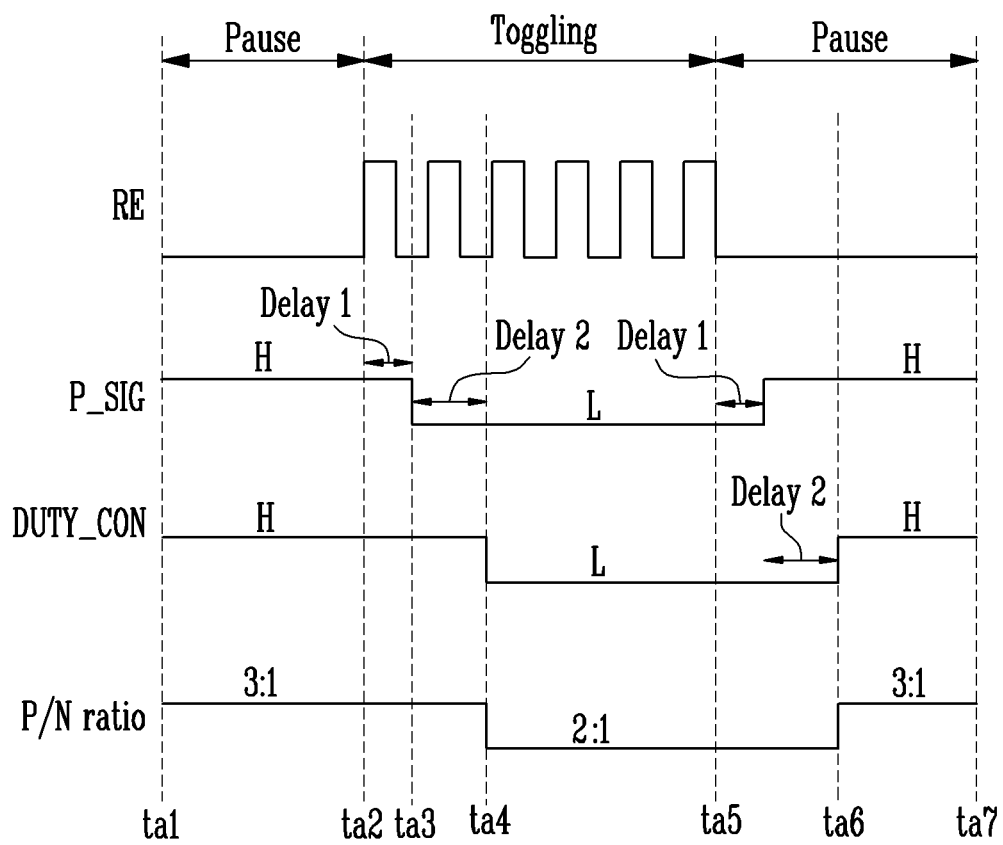
FIG. 12 is a waveform diagram illustrating an output PN ratio according to an embodiment.

FIG. 12 is a waveform diagram illustrating an output PN ratio according to an embodiment.

Referring to FIG. 12, in the period between ta1 and ta2, the input signal RE may be in the pause state Pause. In the period of between ta2 and ta5, the input signal RE may be in the toggle state Toggling. In the period of between ta5 and ta7, the input signal RE may be in the pause state Pause.

According to an embodiment, when the input signal RE is in the pause state Pause, the pause signal P_SIG may have the logic high level H and when the input signal RE is in the toggle state Toggling, the pause signal P_SIG may have the logic low level L.

According to an embodiment, the pause signal P_SIG may be output after the first delay Delay 1 has passed from the input of the input signal RE. The first delay Delay 1 may be an asynchronous delay or a synchronous delay. The first delay Delay 1 may be variously determined according to a target output PN ratio. When the first delay Delay 1 is the asynchronous delay, the first delay Delay 1 may be determined based on the internal delay of the pause detector 310 described with reference to FIG. 4.

Accordingly, in the period between ta1 and ta3, the pause signal P_SIG may have the logic high level H. In the period between ta3 and ta5 and from ta5 until the first delay Delay 1 has passed, the pause signal P_SIG may have the logic low level L. In the period of from the time that the first delay Delay 1 has passed to ta7, the pause signal P_SIG may have the logic high level H.

According to an embodiment, the duty control signal DUTY_CON may be output after a second delay Delay 2 has passed from output of the pause signal P_SIG. The second delay Delay 2 may be an asynchronous delay or a synchronous delay. The second delay Delay 2 may be variously determined according to the target output PN ratio.

When the second delay Delay 2 is the asynchronous delay, the second delay Delay 2 may be determined based on a circuit delay of the duty control signal generator 321 described with reference to FIG. 8. When the second delay Delay 2 is the synchronous delay, the second delay Delay 2 may be determined based on an internal clock of the duty control signal generator 321. According to various embodiments, the duty control signal DUTY_CON may be output without a delay from the output of the pause signal P_SIG.

According to an embodiment, the pause signal P_SIG may be output as the duty control signal DUTY_CON after the second delay Delay 2 has passed from the input of the pause signal P_SIG. When the second delay Delay 2 is the synchronous delay, the second delay Delay 2 may be determined based on a predetermined clock. The predetermined clock may be the internal clock of the duty control signal generator 321.

In the period between ta1 and ta2, the input signal RE may be in the pause state Pause and the duty control signal DUTY_CON may have the logic high level H.

In the period between ta2 and ta3, although the input signal RE is in the toggle state Toggling, the duty control signal DUTY_CON may maintain the logic high level H due to the first delay Delay 1 between the input signal RE and the pause signal P_SIG.

In the period between ta3 and ta4, although the input signal RE is in the toggle state Toggling, the duty control signal DUTY_CON may maintain the logic high level H due to the second delay Delay 2 between the pause signal P_SIG and the duty control signal DUTY_CON.

In the period between ta4 and ta5, the input signal RE may be in the toggle state Toggling and the duty control signal DUTY_CON may have the logic low level L.

In the period between ta5 and ta6, although the input signal RE is in the pause state Pause, the duty control signal DUTY_CON may maintain the logic low level L due to the first delay Delay 1 between the input signal RE and the pause signal P_SIG and the second delay Delay 2 between the pause signal P_SIG and the duty control signal DUTY_CON.

In the period between ta6 and ta7, the input signal RE may be in the pause state Pause and the duty control signal DUTY_CON may have the logic high level H.

According to an embodiment, an output PN ratio (P/N ratio) may be controlled according to the duty control signal DUTY_CON. Accordingly, in the period between ta1 and ta4, the output PN ratio may be controlled to be 3:1. In the period between ta4 and ta6, the output PN ratio may be controlled to be 2:1. In the period between ta6 and ta7, the output PN ratio may be controlled to be 3:1.

According to an embodiment, an output PN ratio during at least one cycle including the first cycle of an output signal generated based on the input signal RE may be controlled to be 3:1 due to the first and second delays Delay 1 and Delay 2 between the input of the input signal RE and the output of the duty control signal DUTY_CON. After at least one cycle has passed, the output PN ratio may be controlled to be 2:1. How cycles are to pass may be determined based on the first and second delays Delay 1 and Delay 2.

According to an embodiment, an output PN ratio during at least one cycle including the first cycle of an output signal may be a first PN ratio, that is, 3:1. The output PN ratio after at least one cycle may be a second PN ratio, that is, 2:1. The first PN ratio may be greater than the second PN ratio. According to another embodiment, the first PN ratio may be less than the second PN ratio.

Figure 13:
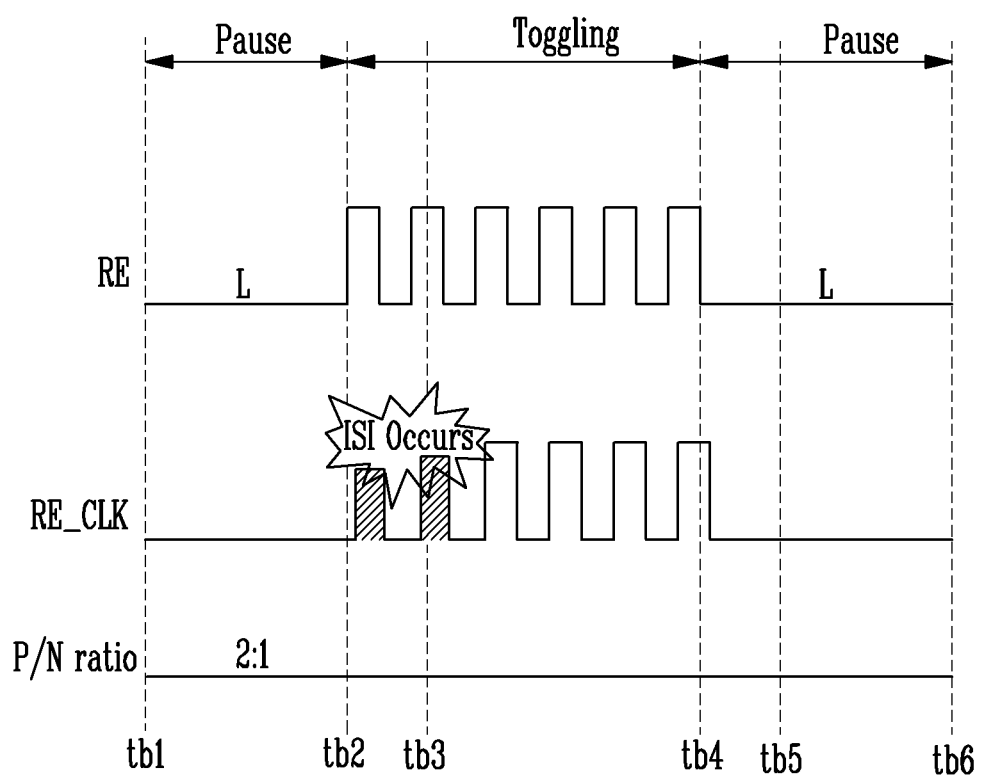
FIG. 13 is a diagram illustrating occurrence of intersymbol interference (ISI)

FIG. 13 is a diagram illustrating occurrence of intersymbol interference (ISI).

Referring to FIG. 13, an output PN ratio (P/N ratio) may be set as 2:1 regardless of whether the input signal RE is in the pause state Pause or the toggle state Toggling.

When the input signal RE is switched from the pause state Pause to the toggle state Toggling, the output signal RE_CLK may also be switched from the pause state Pause to the toggle state Toggling in response to the conversion of the state of the input signal RE. The output signal RE_CLK may have a low level in the pause state Pause (i.e., in the period between tb1 and tb2). The output signal RE_CLK may pulse or oscillate between a low level and a high level at a fixed frequency in the toggle state Toggling (i.e., in the period between tb2 and tb4).

Intersymbol interference (ISI) may refer to a phenomenon in which a subsequent signal is distorted by interference of a previous signal, such as noise.

For example, when the output signal RE_CLK is switched from the pause state Pause to the toggle state Toggling, the output of the output signal RE_CLK may maintain a low level for a relatively long time and then abruptly transition to a high level. Accordingly, because the output of the output signal RE_CLK has maintained the low level for a relatively long time, the output of the output signal RE_CLK might not rise to a level high enough when the output signal RE_CLK is in the toggle state Toggling.

Accordingly, a phenomenon in which the output signal RE_CLK is not properly output during at least one cycle including the first cycle of the output signal RE_CLK may correspond to ISI.

Figure 14:
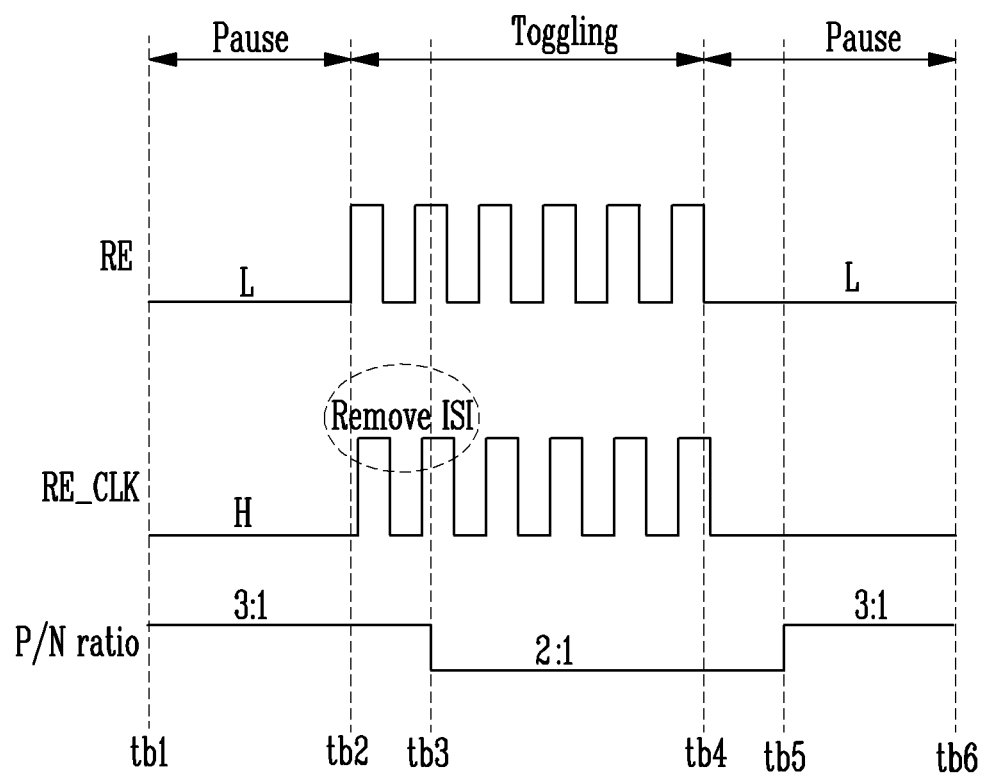
FIG. 14 is a diagram illustrating removal of intersymbol interference (ISI) according to an embodiment of the present disclosure.

FIG. 14 is a diagram illustrating removal of intersymbol interference (ISI) according to an embodiment of the present disclosure.

Referring to FIG. 14, a first PN ratio may be 3:1. A second PN ratio may be 2:1. The second PN ratio may be the default PN ratio. An output PN ratio may be determined to be the first PN ratio or the second PN ratio.

Referring back to FIG. 13, ISI may occur in the period between tb2 and tb3 when the output PN ratio is controlled to be the second PN ratio regardless of whether the input signal RE is in the pause state Pause or the toggle state Toggling.

In other words, when the output signal RE_CLK is switched from the pause state Pause to the toggle state Toggling, because the output of the output signal RE_CLK has maintained the low level for a long time, the output of the output signal RE_CLK might not rise to a level high enough.

In FIG. 14, in the period between tb2 and tb3 where ISI occurs, the output PN ratio may be controlled to be the first PN ratio which is greater than the second PN ratio. When the output PN ratio increases, the level of an up-pulse component of the output signal RE_CLK may be amplified.

Accordingly, when the output signal RE_CLK is switched from the pause state Pause to the toggle state Toggling, even when the output of the output signal RE_CLK has maintained the low level for a long time, the output of the output signal RE_CLK may rise to a level high enough.

In other words, the ISI may be mitigated or removed by controlling the output PN ratio to be the first PN ratio, which is greater than the second (default) PN ratio, during at least one cycle including the first cycle of the output signal RE_CLK.

Figure 15:
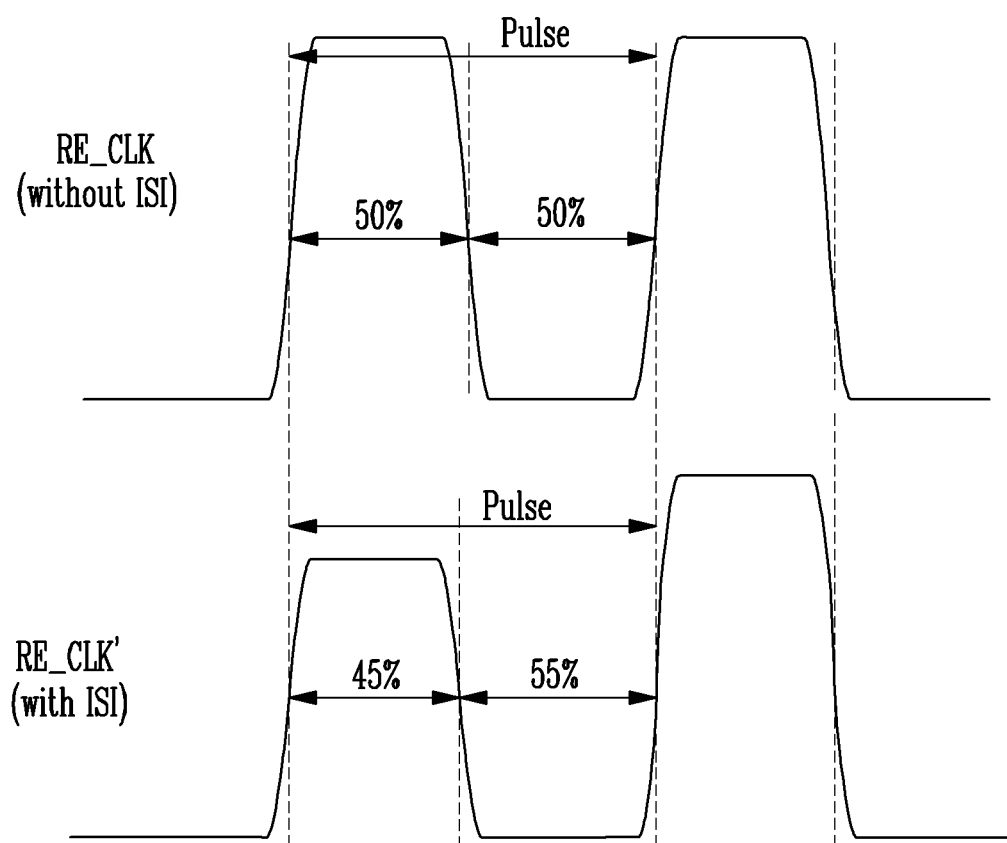
FIG. 15 is a diagram illustrating a duty cycle of an output signal according to intersymbol interference (ISI)

FIG. 15 is a diagram illustrating a duty cycle of an output signal with and without intersymbol interference (ISI).

Referring to FIG. 15, the duty cycle may refer to a ratio of an activated period to an entire cycle of the output signal RE_CLK. The duty cycle may refer to a ratio of a period of a cycle during which a high pulse is output, that is, a high pulse period, to the entire cycle. The high pulse period may refer to a period in which output of a signal exceeds a middle value between the minimum value and the maximum value of the output of the signal RE_CLK.

When ISI has not occurred, a duty cycle of the normal output signal RE_CLK may be 50%. That is, the ratio of an activated period to an inactivated period during one cycle may be 50:50. In other words, a ratio of a high pulse period (i.e., an up pulse portion of one period) to a low pulse period (i.e., a down pulse portion of one period) during one pulse period may be 50:50. However, 50% is merely given as an example of a duty cycle within a normal range; as those skilled in the art will understand the normal range includes duty cycles less than and greater than 50%.

When ISI occurs, an up-pulse component may be weaker than a down-pulse component during at least one cycle including the first cycle of an output signal RE_CLK'. According to an embodiment, ISI may occur when an output signal switches from a pause state to a toggle state.

When the up-pulse component is weaker than the down-pulse component due to the ISI, a duty cycle of the output signal RE_CLK' may be 45%. In other words, a ratio of an activated period to an inactivated period during one cycle may be 45:55. In other words, a ratio of a high pulse period (i.e., an up pulse portion of the entire period) to a low pulse period (i.e., a down pulse portion of the entire period) during one pulse period may be 45:55.

According to an embodiment of the present disclosure, ISI may be mitigated by controlling an output PN ratio when an output signal switches from a pause state to a toggle state. In other words, a duty cycle of the output signal may be adjusted to fall under a normal range by controlling the output PN ratio when the output signal switches from the pause state to the toggle state.

According to an embodiment of the present disclosure, ISI may be mitigated by controlling an output PN ratio during at least one cycle including the first cycle of an output signal. In other words, a duty cycle of the output signal may be adjusted to fall under a normal range by controlling the output PN ratio during at least one cycle including the first cycle of the output signal.

Figure 16:
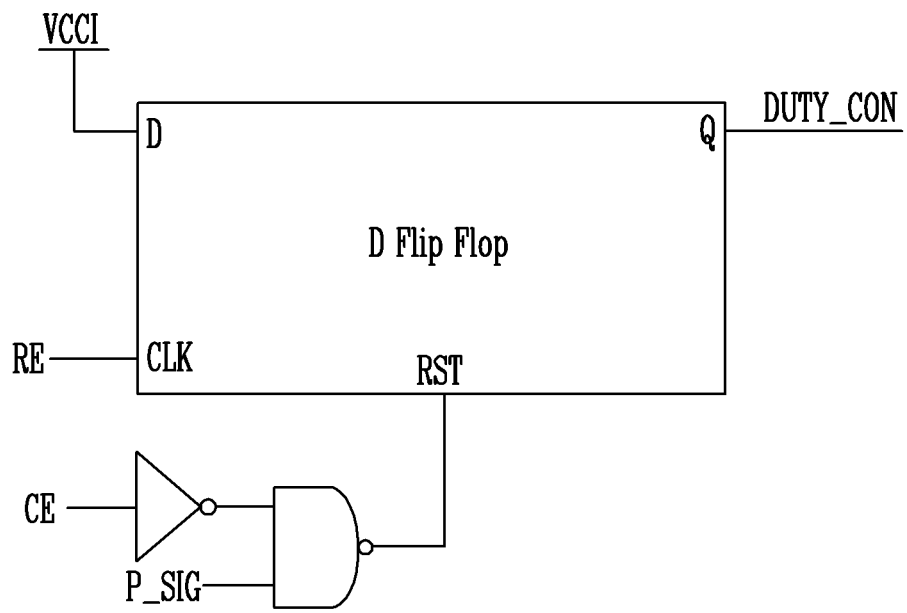
FIG. 16 is a diagram illustrating a duty control signal generator, such as that shown in FIG. 8, according to an embodiment.

FIG. 16 is a diagram illustrating the duty control signal generator 321 shown in FIG. 8 according to an embodiment.

Referring back to FIG. 8, after the pause signal P_SIG is input to the duty control signal generator 321 and a target delay has passed, the duty control signal generator 321 may output the pause signal P_SIG as the duty control signal DUTY_CON. The target delay may be an asynchronous delay or a synchronous delay. The asynchronous delay may be determined based on the circuit delay of the duty control signal generator 321.

According to an embodiment, when the target delay is a synchronous delay, the duty control signal generator 321 may include a delay circuit which delays the pause signal P_SIG a set period of time and then outputs the delayed pause signal P_SIG as the duty control signal DUTY_CON. The delay circuit may be provided in any of various forms such as a latch circuit, an inverter circuit, or a counter circuit.

Referring to FIG. 16, as an embodiment of the delay circuit, the duty control signal generator 321 may include a latch circuit. However, configuration of the delay circuit is not limited to this embodiment. The latch circuit may include a D flip-flop circuit.

The D flip-flop circuit may receive a power voltage VCCI as input data D. According to another embodiment, the D flip-flop circuit may receive a ground voltage as the input data D.

The D flip-flop circuit may receive the input signal RE as a clock signal CLK. According to various embodiments, the D flip-flop circuit may receive a clock signal CLK that is generated by dividing or multiplying the input signal RE.

The D flip-flop circuit may be synchronized with the clock signal CLK to output the duty control signal DUTY_CON as output data Q.

For example, because the D flip-flop circuit receives the power voltage VCCI as the input data D, the D flip-flop circuit may be synchronized with the clock signal CLK to output the duty control signal DUTY_CON which has a logic high level. When a reset signal RST is activated, the D flip-flop circuit may output the duty control signal DUTY_CON which has a logic low level.

The D flip-flop circuit may be reset according to the pause signal P_SIG.

According to an embodiment, a signal may be generated by performing a NAND operation on the inverted chip enable signal CE and the pause signal P_SIG. Then, the generated signal may be input to the D flip-flop circuit as the reset signal RST.

When the chip enable signal CE has a logic low level, a memory chip to which the chip enable signal CE is applied may be in an activated state in which an operation is performed. When the chip enable signal CE has a logic high level, a memory chip to which the chip enable signal CE is applied may be in an inactivated state in which an operation is not performed. When the pause signal P_SIG has a logic high level, the input signal RE may be in the pause state Pause. When the pause signal P_SIG has a logic low level, the input signal RE may be in the toggle state Toggling.

When the chip enable signal CE has a logic high level, the reset signal RST may be activated and have a logic high level. In other words, when the memory chip is in an inactivated state in which an operation is not being performed, the reset signal RST may be activated and the duty control signal DUTY_CON may be inactivated and have a logic low level.

When the chip enable signal CE has a logic low level, the memory chip may be in an activated state in which an operation is being performed, and the reset signal RST may be activated according to the pause signal P_SIG.

For example, when the pause signal P_SIG has a logic high level, the reset signal RST may be inactivated and have a logic low level. When the pause signal P_SIG has a logic low level, the reset signal RST may be activated and have a logic high level.

In other words, when the memory chip is in an activated state and the input signal RE is in the pause state Pause, the reset signal RST may be inactivated. When the memory chip is in an activated state and the input signal RE is in the toggle state Toggling, the reset signal RST may be activated.

As a result, when the memory chip is in the inactivated state, the reset signal RST may be activated. Even when the memory chip is in the activated state, when the input signal RE is in the toggle state Toggling and the pause signal P_SIG has a logic low level, the reset signal RST may be activated. Even when the memory chip is in the activated state, when the input signal RE is in the pause state Pause and the pause signal P_SIG has a logic high level, the reset signal RST may be inactivated.

Accordingly, when the pause signal P_SIG has a logic high level, the D flip-flop circuit may output the duty control signal DUTY_CON having a logic high level. Alternatively, when the pause signal P_SIG has a logic low level, the D flip-flop circuit may output the duty control signal DUTY_CON having a logic low level.

When the input signal RE is in the pause state Pause, the D flip-flop circuit may output the duty control signal DUTY_ CON having a logic high level. Alternatively, when the input signal RE is in the toggle state Toggling, the D flip-flop circuit may output the duty control signal DUTY_CON having a logic low level.

According to various embodiments, a signal generated by inverting the pause signal P_SIG may be directly input to the D flip-flop circuit as the reset signal RST of the D flip-flop circuit. According to this embodiment, when the input signal RE is in the toggle state Toggling, and thus the pause signal P_SIG has a logic low level, the reset signal RST may be activated. When the input signal RE is in the pause state Pause, and thus the pause signal P_SIG has a logic high level, the reset signal RST may be inactivated.

According to an embodiment of the present disclosure, the duty control signal DUTY_CON which is synchronized with the clock signal CLK and is activated according to the pause signal P_SIG may be output through the D flip-flop circuit.

According to an embodiment, a delay between the pause signal P_SIG and the duty control signal DUTY_CON may be determined to be a period of time which is set according to a division ratio or a multiplication ratio of the clock signal CLK. According to an embodiment, a delay circuit may further include a separate circuit for controlling a delay between the pause signal P_SIG and the duty control signal DUTY_CON.

Figure 17:
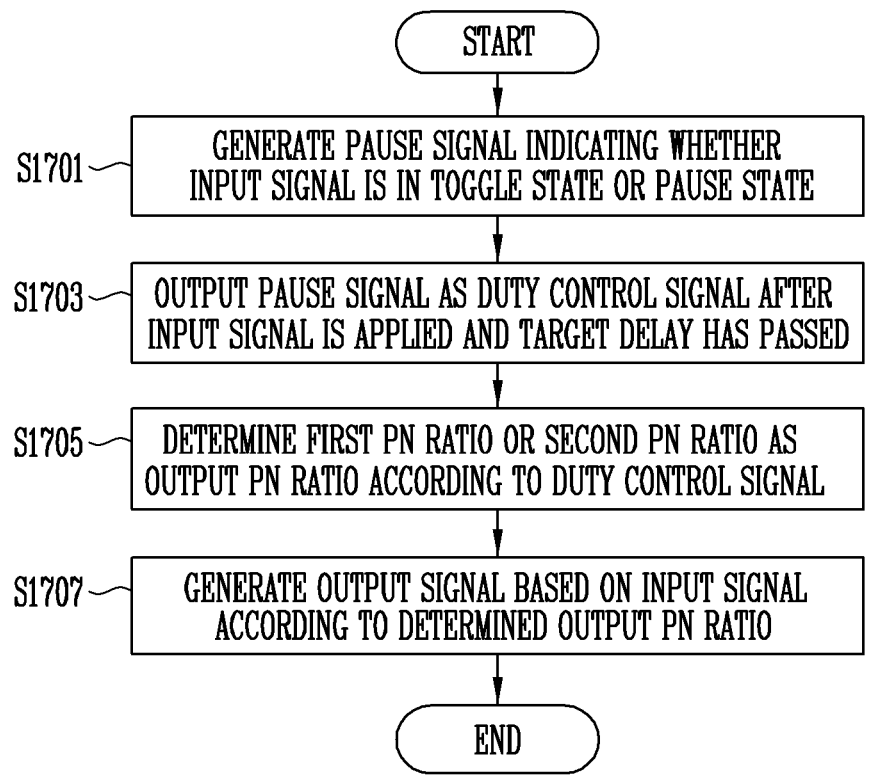
FIG. 17 is a flowchart illustrating an operation of a buffer circuit according to an embodiment of the present disclosure.

FIG. 17 is a flowchart illustrating an operation of a buffer circuit according to an embodiment of the present disclosure.

Referring to FIG. 17, in operation S1701, the buffer circuit may generate a pause signal indicating whether an input signal is in a toggle state or a pause state.

In operation S1703, after the input signal is applied to the buffer circuit and a target delay has passed, the buffer circuit may output the pause signal as a duty control signal. The target delay may be an asynchronous delay or a synchronous delay. When the target delay is the asynchronous delay, the target delay may be determined based on a circuit delay of the buffer circuit. When the target delay is the synchronous delay, the target delay may be determined to be a specific period of time.

In operation S1705, the buffer circuit may determine a first PN ratio or a second PN ratio as an output PN ratio according to the duty control signal. The second PN ratio may be less than the first PN ratio.

In operation S1707, the buffer circuit may generate an output signal based on the input signal according to the determined output PN ratio. An up-pulse component of the output signal may be adjusted according to the output PN ratio.

According to an embodiment, the first PN ratio may be determined as the output PN ratio during at least one cycle including the first cycle of the output signal. After at least one cycle has passed, the second PN ratio may be determined as the output PN ratio. How many cycles pass before the second PN ratio is determined as the output PN ratio may be determined based on the clock.

Accordingly, the buffer circuit may generate the output signal according to the first PN ratio during at least one cycle including the first cycle of the output signal, and after at least one cycle has passed, the buffer circuit may generate the output signal according to the second PN ratio. The second PN ratio may be a default PN ratio.

According to an embodiment, the buffer circuit generates the output signal at a PN ratio greater than the default PN ratio during at least one cycle including the first cycle of the output signal, such that the level of the up-pulse component of the output signal may be amplified and ISI may be mitigated during at least one cycle.

Figure 18:
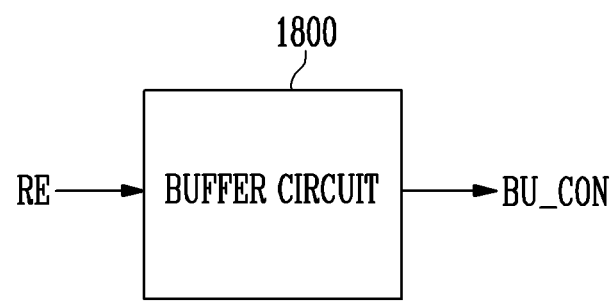
FIG. 18 is a diagram illustrating a buffer circuit according to another embodiment of the present disclosure.

FIG. 18 is a diagram illustrating a buffer circuit according to another embodiment of the present disclosure.

Referring to FIG. 18, a buffer circuit 1800 may be included in the memory device 100 shown in FIG. 2. The buffer circuit 1800 may be disposed in a receive stage of the memory device 100. The buffer circuit 1800 may receive an input signal transferred to the memory device 100.

According to another embodiment, the buffer circuit 1800 may be included in the storage device 50 but disposed external to the memory device 100.

The buffer circuit 1800 may generate an output signal based on an input signal. According to another embodiment of the present disclosure, the input signal may be the read enable signal RE. The output signal may be a buffer control signal BU_CON. The input signal and the output signal are not limited to these two types of signals.

The buffer circuit 1800 may generate the buffer control signal BU_CON based on the read enable signal RE received from the memory controller 200. The memory device 100 may control input buffer circuits included in the memory device 100 according to the buffer control signal BU_CON generated by the buffer circuit 1800. More specifically, the memory device 100 may inactivate the input buffer circuits or control an amount of current of the input buffer circuits.

Figure 19:
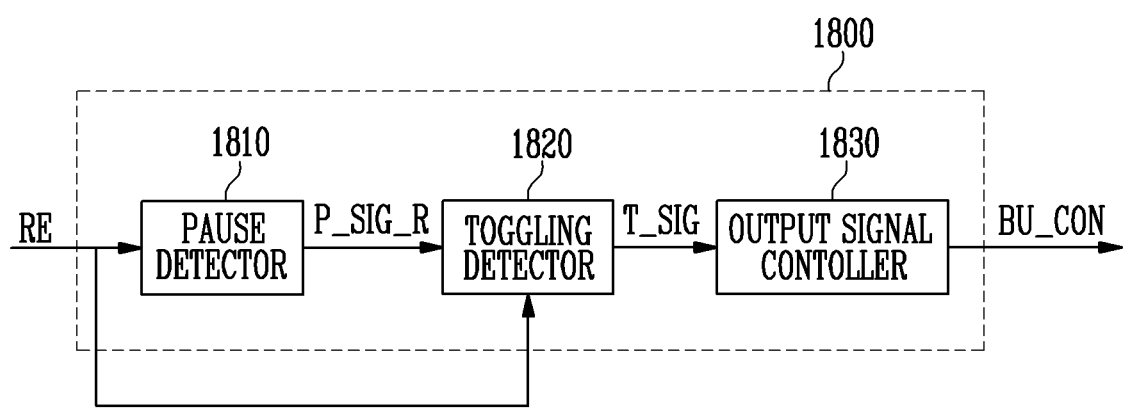
FIG. 19 is a diagram illustrating a structure and an operation of a buffer circuit according to another embodiment of the present disclosure.

FIG. 19 is a diagram illustrating a structure and an operation of a buffer circuit according to another embodiment of the present disclosure.

Referring to FIG. 19, the buffer circuit 1800 may include a pause detector 1810, a toggle detector 1820, and an output signal controller 1830.

In FIG. 19, an input signal may be the read enable signal RE and an output signal may be the buffer control signal BU_CON. However, the input signal and the output signal are not limited to these two types of signals.

The pause detector 1810 may generate a pause signal P_SIG_R indicating whether the input signal, i.e., the read enable signal RE, is in the pause state Pause. The pause signal P_SIG_R may be generated by inverting the pause signal P_SIG of FIG. 4. For example, when the input signal RE is in the pause state Pause, the pause signal P_SIG of FIG. 4 may have a logic high level and the pause signal P_SIG_R of FIG. 19 may have a logic low level. When the pause signal P_SIG_R has a logic high level, the input signal RE may be in the toggle state Toggling or a reset state Reset.

The toggle detector 1820 may generate a toggle signal T_SIG indicating whether the input signal RE is in the toggle state Toggling. The toggle detector 1820 may generate the toggle signal T_SIG based on the input signal RE and the pause signal P_SIG_R. For example, when the toggle signal T_SIG has a logic high level, the input signal RE may be in the toggle state Toggling. In another example, when the toggle signal T_SIG has a logic low level, the input signal RE may be in the toggle state Toggling.

The output signal controller 1830 may generate the output signal, i.e., the buffer control signal BU_CON, based on the input signal RE. The output signal controller 1830 may control the input buffer circuits according to the toggle signal T_SIG. The input buffer circuits may be inactivated according to the output signal BU_CON.

The output signal controller 1830 may control the input buffer circuits according to the toggle signal T_SIG. An amount of current of the inactivated input buffer circuits may be minimized.

For example, when the input signal RE is in the toggle state Toggling, the toggle signal T_SIG may have a logic high level. When the toggle signal T_SIG has a logic high level, the output signal controller 1830 may generate the output signal BU_CON which inactivates predetermined input buffer circuits among the input buffer circuits. When the toggle signal T_SIG has a logic low level, the output signal controller 1830 may generate the output signal BU_CON which activates the predetermined input buffer circuits among the input buffer circuits.

The predetermined input buffer circuits may include input buffer circuits that receive a command or an address. According to an embodiment of the present disclosure, the predetermined input buffer circuits may include input buffer circuits that receive the command latch enable signal CLE or the address latch enable signal ALE.

According to another embodiment of the present disclosure, when the input signal RE is in the toggle state Toggling, the toggle signal T_SIG may have a logic low level. When the toggle signal T_SIG has a logic low level, the output signal controller 1830 may generate the output signal BU_CON which minimizes an amount of current of the predetermined input buffer circuits among the input buffer circuits. When the amount of current of the predetermined input buffer circuits is minimized, an amount of current consumed by the memory device 100 may be reduced.

Figure 20:
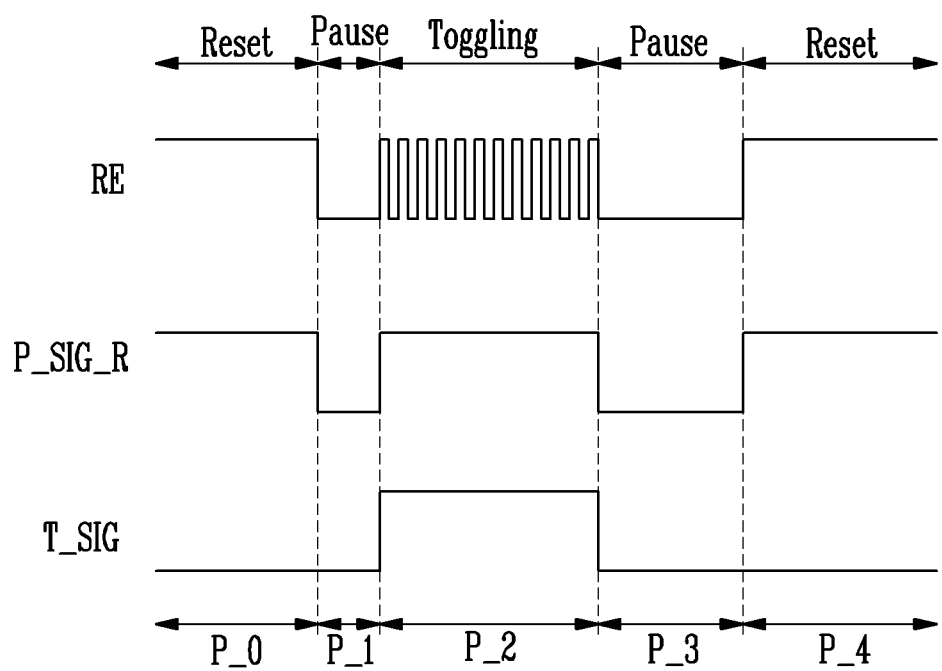
FIG. 20 is a waveform diagram of an input signal, a pause signal, and a toggle signal according to another embodiment of the present disclosure.

FIG. 20 is a waveform diagram of an input signal, a pause signal, and a toggle signal according to another embodiment of the present disclosure.

Referring to FIG. 20, the input signal RE may be in the pause state Pause, the toggle state Toggling, or the reset state Reset. Waveforms of the pause signal P_SIG_R and the toggle signal T_SIG may be changed according to the state of the input signal RE. For example, the pause signal P_SIG_R may have a logic low level when the input signal RE is in the pause state Pause. The toggle signal T_SIG may have a logic high level when the input signal RE is in the toggle state Toggling.

The input signal RE may be in the reset state Reset in a zeroth period P_0. Because the input signal RE is in the reset state Reset, the pause signal P_SIG_R may have a logic high level in the zeroth period P_0. The toggle signal T_SIG may have a logic low level in the zeroth period P_0.

The input signal RE may be in the pause state Pause in a first period P_1. Because the input signal RE is in the pause state Pause, the pause signal P_SIG_R may have a logic low level in the first period P_1. The toggle signal T_SIG may have a logic low level in the first period P_1.

The input signal RE may be in the toggle state Toggling in a second period P_2. Because the input signal RE is in the toggle state Toggling, the pause signal P_SIG_R may have a logic high level in the second period P_2. The toggle signal T_SIG may have a logic high level in the second period P_2.

The input signal RE may be in the pause state Pause in a third period P_3. Because the input signal RE is in the pause state Pause, the pause signal P_SIG_R may have a logic low level in the third period P_3. The toggle signal T_SIG may have a logic low level in the third period P_3. The pause signal P_SIG_R and the toggle signal T_SIG in the third period P_3 may be the same as the pause signal P_SIG_R and the toggle signal T_SIG in the first period P_1.

The input signal RE may be in the reset state Reset in a fourth period P_4. Because the input signal RE is in the reset state Reset, the pause signal P_SIG_R may have a logic high level in the fourth period P_4. The toggle signal T_SIG may have a logic low level in the fourth period P_4. The pause signal P_SIG_R and the toggle signal T_SIG in the fourth period P_4 may be the same as the pause signal P_SIG_R and the toggle signal T_SIG in the zeroth period P_0.

According to an embodiment of the present disclosure, a state of the input signal RE may be determined according to the pause signal P_SIG_R and the toggle signal T_SIG. For example, when the pause signal P_SIG_R and the toggle signal T_SIG have a logic low level, the input signal RE may be in the pause state Pause. When the pause signal P_SIG_R and the toggle signal T_SIG have a logic high level, the input signal RE may be in the toggle state Toggling. When the pause signal P_SIG_R has a logic high level and the toggle signal T_SIG has a logic low level, the input signal RE may be in the reset state Reset.

Figure 21:
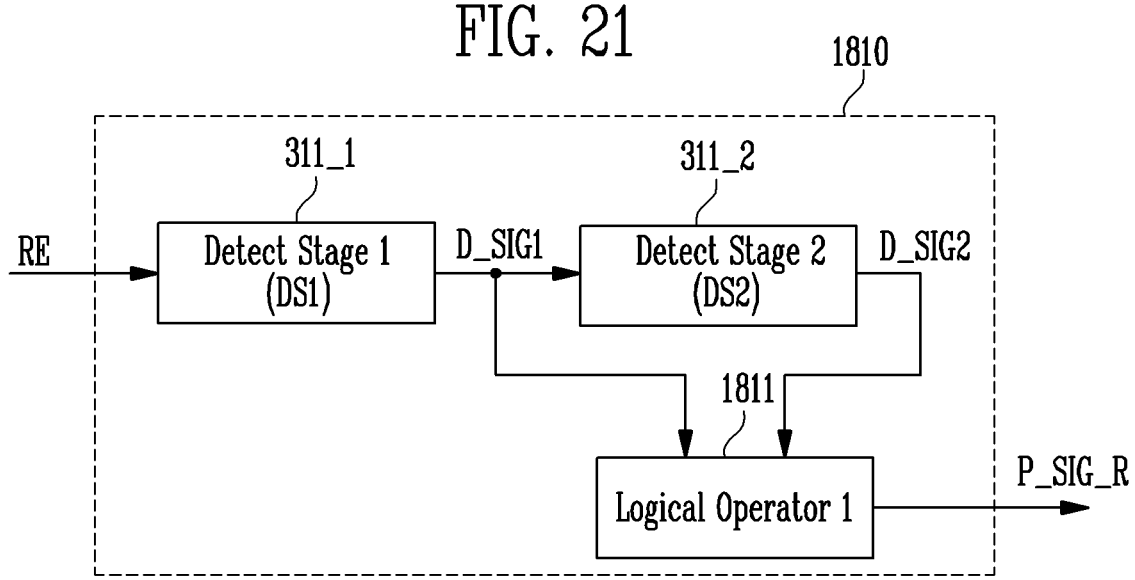
FIG. 21 is a diagram illustrating a configuration and an operation of a pause detector, such as that shown in FIG. 19.

FIG. 21 is a diagram illustrating a configuration and an operation of the pause detector 1810 shown in FIG. 19.

Referring to FIG. 21, the pause detector 1810 may include the first detect stage 311_1, the second detect stage 311_2 and the first logical operator 1811. The pause detector 1810 of FIG. 21 may include the pause detector 310 of FIG. 5.

The pause detector 1810 may detect whether the input signal RE is in the pause state Pause. For example, when the pause signal P_SIG_R has a logic low level, the input signal RE may be in the pause state Pause. When the pause signal P_SIG_R has a logic high level, the input signal RE may be in the toggle state Toggling or the reset state Reset. It may be difficult to distinguish between the toggle state Toggling and the reset state Reset of the input signal RE by the pause signal P_SIG_R. The toggle detector 1820 may distinguish between the toggle state Toggling and the reset state Reset.

Figure 22:
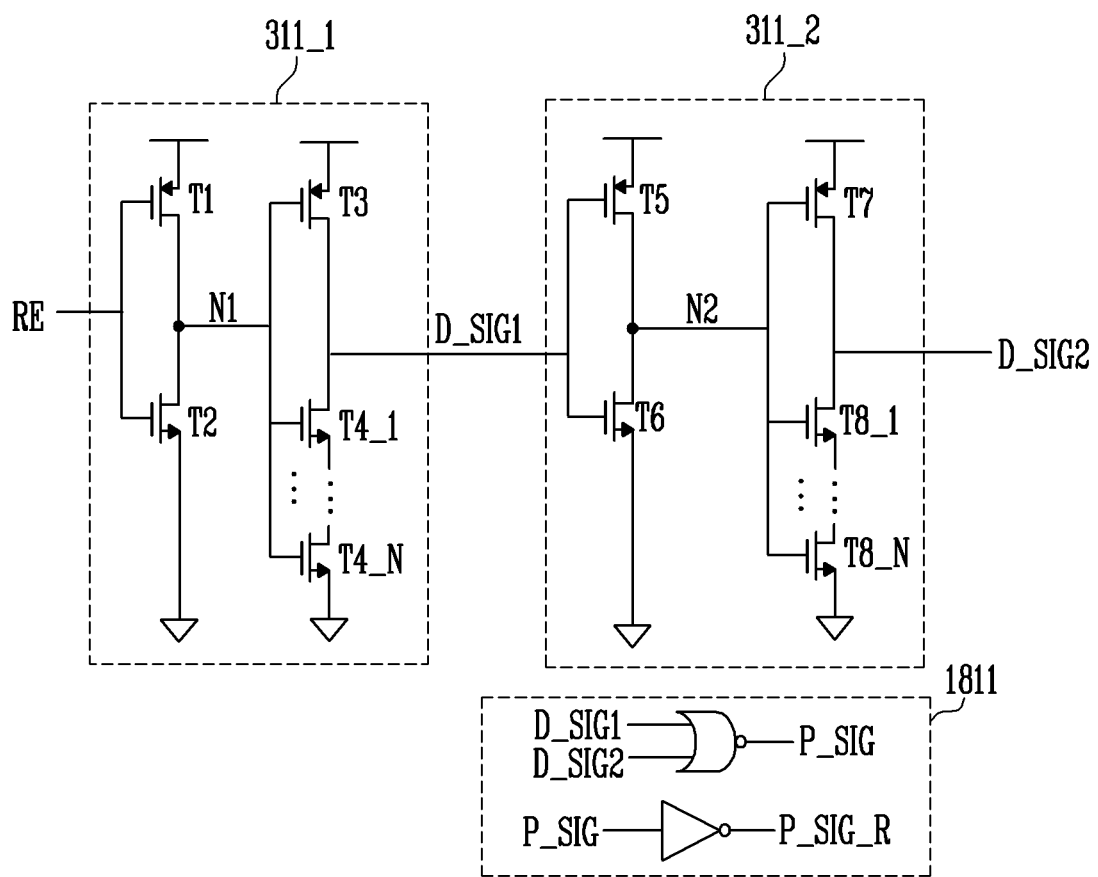
FIG. 22 is a detailed diagram illustrating a configuration of a pause detector, such as that shown in FIG. 19.

FIG. 22 is a detailed diagram illustrating a configuration of the pause detector 1810 shown in FIG. 19.

Referring to FIG. 22, the first detect stage 311_1 may generate the first detection signal D_SIG1 based on the input signal RE. The second detect stage 311_2 may generate the second detection signal D_SIG2 based on the first detection signal D_SIG1. The first logical operator 1811 may perform a logical operation on the first detection signal D_SIG1 and the second detection signal D_SIG2.

The first logical operator 1811 may include the logical operator 312 of FIG. 5. and inverter. The first logical operator 1811 may generate the pause signal P_SIG_R by inverting the pause signal P_SIG of FIG. 6. The first logical operator 1811 may generate the pause signal P_SIG_R indicating that the input signal RE is in the pause state Pause in response to the first detection signal D_SIG1 or the second detection signal D_SIG2 indicating the pause state Pause of the input signal RE. The first detect stage 311_1, the second detect stage 311_2, and the logical operator 312 may correspond to the descriptions provided with reference to FIG. 6.

Figure 23:
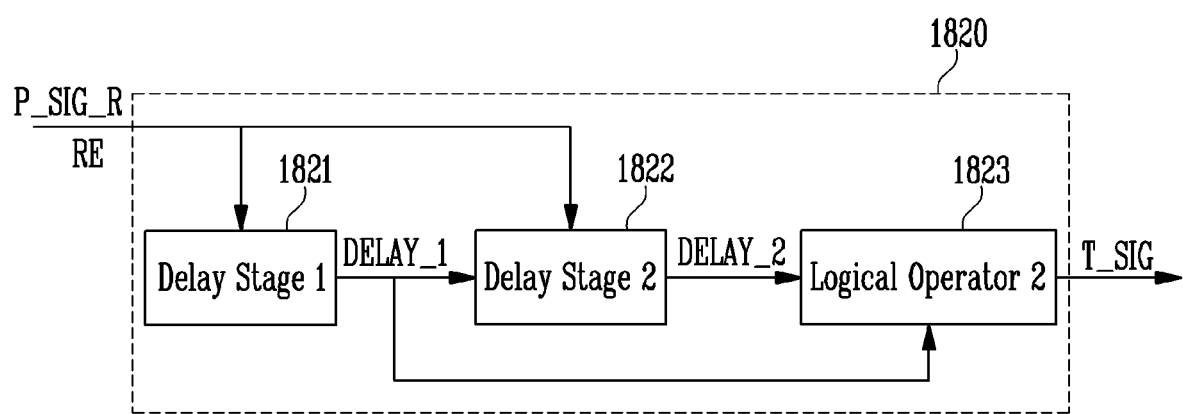
FIG. 23 is a diagram illustrating a configuration and an operation of a toggle detector, such as that shown in FIG. 19.

FIG. 23 is a diagram illustrating a configuration and an operation of the toggle detector 1820 shown in FIG. 19.

Referring to FIG. 23, the toggle detector 1820 may include a first delay stage 1821, a second delay stage 1822, and a second logical operator 1823. According to an embodiment of the present disclosure, the toggle detector 1820 may receive the pause signal P_SIG_R and transfer the received pause signal P_SIG_R to the first delay stage 1821 and the second delay stage 1822.

The first delay stage 1821 may receive the input signal RE and the pause signal P_SIG_R. The first delay stage 1821 may generate a first delay signal DELAY_1 after a predetermined delay elapses. The first delay stage 1821 may be synchronized with a clock signal generated based on the input signal RE and the pause signal P_SIG_R to generate the first delay signal DELAY_1. The first delay stage 1821 may be reset according to the pause signal P_SIG_R.

The second delay stage 1822 may receive the input signal RE, the pause signal P_SIG_R, and the first delay signal DELAY_1. The second delay stage 1822 may generate a second delay signal DELAY_2 after a predetermined delay elapses. The second delay stage 1822 may be synchronized with a clock signal generated based on the input signal RE and the pause signal P_SIG_R to generate the second delay signal DELAY_2. The second delay stage 1822 may be reset according to the pause signal P_SIG_R.

The first delay signal DELAY_1 may be generated by delaying the input signal RE. The second delay signal DELAY_2 may be generated by delaying the first delay signal DELAY_1. The input signal RE may be delayed more when the second delay signal DELAY_2 is generated than when the first delay signal DELAY_1 is generated.

The second logical operator 1823 may perform a logical operation on the first delay signal DELAY_1 and the second delay signal DELAY_2 to generate the toggle signal T_SIG. The second logical operator 1823 may generate the toggle signal T_SIG having a predetermined pulse level when the input signal RE is in the toggle state Toggling. According to an embodiment of the present disclosure, the logical operation may include an AND operation.

The toggle signal T_SIG may have different logic levels depending on a state of the input signal RE. For example, when the input signal RE is in the toggle state Toggling, the toggle signal T_SIG may have a logic high level. When the input signal RE is in the pause state Pause or the reset state Reset, the toggle signal T_SIG may have a logic low level.

According to another embodiment of the present disclosure, the toggle detector 1820 may include at least two delay stages. At least two delay stages may be coupled by a cascade method. Delay signals respectively generated by at least two delay stages may be input to the second logical operator 1823.

When the number of delay stages in the toggle detector 1820 increases, accuracy of the toggle detector 1820 may be improved. However, when the number of delay stages in the toggle detector 1820 increases, a delay of the toggle signal T_SIG may increase.

Figure 24:
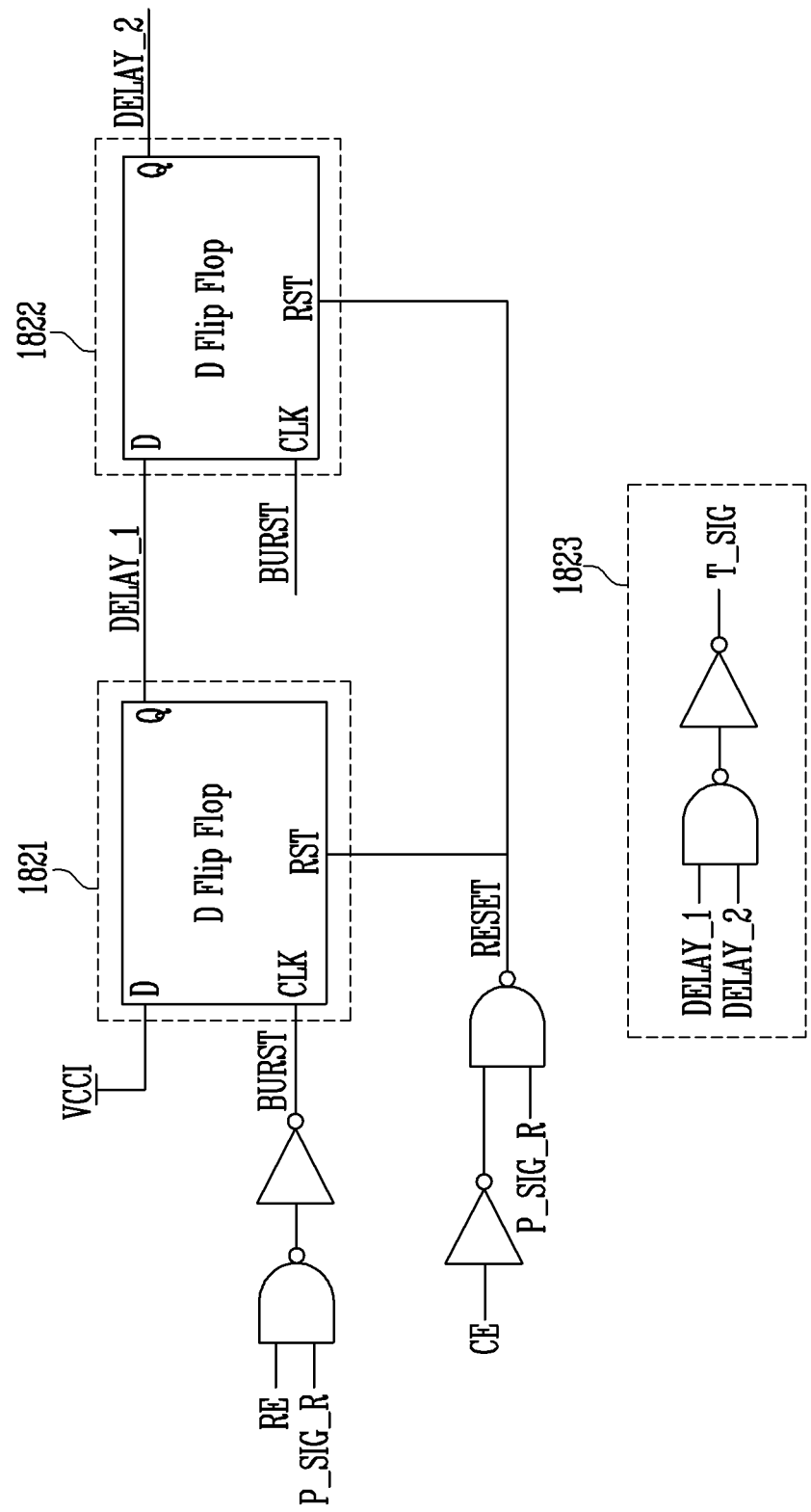
FIG. 24 is a detailed diagram illustrating a configuration of a toggle detector, such as that shown in FIG. 19.

FIG. 24 is a detailed diagram illustrating a configuration of the toggle detector 1820 shown in FIG. 19.

Referring to FIG. 24, each of the first delay stage 1821 and the second delay stage 1822 may include a delay circuit. The delay circuit may be a synchronous delay circuit or an asynchronous delay circuit. The delay circuit may be provided in any of various forms such as a latch circuit, an inverter circuit, and a counter circuit.

According to an embodiment of the present disclosure, each of the first delay stage 1821 and the second delay stage 1822 may include a D flip-flop circuit. However, the delay circuit in the delay stage is not limited to these types of circuits.

The first delay stage 1821 may include a first delay circuit that is synchronized with the clock signal CLK generated based on the input signal RE and the pause signal P_SIG_R to generate the first delay signal DELAY_1 and is reset according to the pause signal P_SIG_R. The first delay circuit may be a D flip-flop circuit receiving the power voltage VCCI as the input data D.

The D flip-flop circuit may receive an operation result of an AND operation on the input signal RE and the pause signal P_SIG_R as the clock signal CLK. The D flip-flop circuit may be synchronized with the clock signal CLK to output the first delay signal DELAY_1 as the output data Q.

A signal may be generated by performing a NAND operation on the inverted chip enable signal CE and the pause signal P_SIG_R. Then, the D flip-flop circuit may receive an operation result of the NAND operation, that is, the generated signal, as the reset signal RST. When the reset signal RST is activated, the D flip-flop circuit may output the first delay signal DELAY_1 having a logic low level as the output data Q.

The D flip-flop circuit may output the input data D of a case where the clock signal CLK that is input has a rising edge. When the input clock signal CLK does not have a rising edge, the output of the D flip-flop circuit may be maintained. When the reset signal RST that is input is activated, the D flip-flop circuit may output an output signal having a logic low level.

When the clock signal CLK input to the D flip-flop circuit is in the toggle state Toggling, the D flip-flop circuit may output the first delay signal DELAY_1 having a logic high level. The output first delay signal DELAY_1 may be delayed more than the clock signal CLK.

The second delay stage 1822 may include a second delay circuit that is synchronized with the clock signal CLK generated based on the input signal RE and the pause signal P_SIG_R to generate the second delay signal DELAY_2 and is reset according to the pause signal P_SIG_R. The second delay circuit may be a D flip-flop circuit receiving the first delay signal DELAY_1 as the input data D.

The D flip-flop circuit may receive an operation result of an AND operation on the input signal RE and the pause signal P_SIG_R as the clock signal CLK. The D flip-flop circuit may be synchronized with the clock signal CLK to output the second delay signal DELAY_2 as the output data Q.

A signal may be generated by performing a NAND operation on the inverted chip enable signal CE and the pause signal P_SIG_R. Then, the D flip-flop circuit may receive an operation result of the NAND operation, that is, the generated signal, as the reset signal RST. When the reset signal RST is activated, the D flip-flop circuit may output the second delay signal DELAY_2 having a logic low level as the output data Q.

When the clock signal CLK input to the D flip-flop circuit is in the toggle state Toggling, the D flip-flop circuit may output the second delay signal DELAY_2 having a logic high level.

The output second delay signal DELAY_2 may be delayed more than the first delay signal DELAY_1.

The second logical operator 1823 may perform a logical operation on the first delay signal DELAY_1 and the second delay signal DELAY_2 to generate the toggle signal T_SIG. According to an embodiment of the present disclosure, the logical operation may include an AND operation.

According to an embodiment of the present disclosure, the second logical operator 1823 may generate the toggle signal T_SIG indicating that the input signal RE is in the toggle state Toggling in response to the first delay signal DELAY_1 and the second delay signal DELAY_2 indicating the toggle state Toggling of the input signal RE. For example, the toggle signal T_SIG may have a logic high level only when both the first delay signal DELAY_1 and the second delay signal DELAY_2 have a logic high level.

According to another embodiment of the present disclosure, the second logical operator 1823 may generate the toggle signal T_SIG indicating that the input signal RE is in the toggle state Toggling after at least two rising edges from a first rising edge among a plurality of rising edges included in the toggle stage Toggling of the input signal RE. For example, the toggle signal T_SIG may be a result of performing an AND operation on the first delay signal DELAY_1 and the second delay signal DELAY_2. The first delay stage 1821 and the second delay stage 1822 may output a delayed signal. The toggle signal T_SIG may have a logic high level at a time point that is delayed than a time point when the toggle state Toggling of the clock signal CLK starts.

Figure 25:
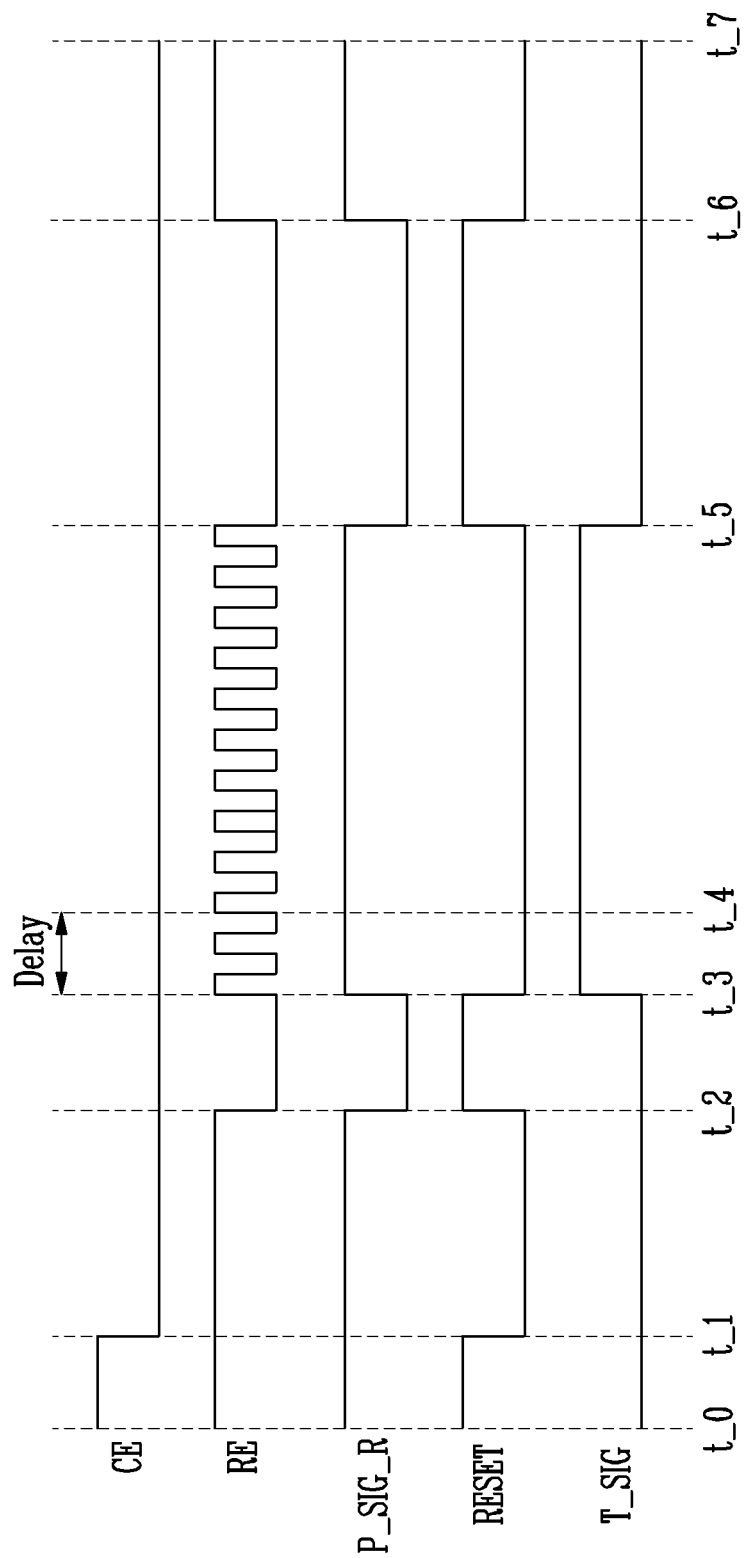
FIG. 25 is a waveform diagram illustrating a toggle signal according to another embodiment of the present disclosure.

FIG. 25 is a waveform diagram illustrating the toggle signal T_SIG according to another embodiment of the present disclosure.

Referring to FIG. 25, the toggle signal T_SIG may have a logic high level at a time point that is delayed than a time point when the toggle state Toggling of the input signal RE starts. A waveform shown in FIG. 25 may be a waveform of the signals shown in FIG. 24.

The chip enable signal CE may have a logic high level only in the period between t0 and t1 and have a logic low level in the remaining period (that is, in the period between t_1 to t_7). A result of a logical operation on the chip enable signal CE and the pause signal P_SIG_R may be input as the reset signal RST of the D flip-flop circuit.

The input signal RE may have a logic high level in the period between t_0 and t_2 and the period between t_6 and t_7. The input signal RE may be in the reset state Reset in the period between t_0 and t_2 and the period between t_6 and t_7. The input signal RE may have a logic low level in the period between t_2 and t_3 and the period between t_5 and t_6. The input signal RE may be in the pause state Pause in the period between t_2 and t_3 and the period between t_5 and t_6. The input signal RE may be in the toggle state Toggling in the period between t_3 and t_5.

The pause signal P_SIG_R may have a logic high level in the period between t_0 and t_2, the period between t_3 and t_5, and the period between t_6 and t_7. When the pause signal P_SIG_R has a logic high level, the input signal RE may be in the reset state Reset or the toggle state Toggling. The pause signal P_SIG_R may have a logic low level in the period between t_2 and t_3 and the period between t_5 and t_6. When the pause signal P_SIG_R has a logic row level, the input signal RE may be in the pause state Pause.

A reset signal RESET, which is a result of performing a logical operation on the chip enable signal CE and the pause signal P_SIG_R, may have a logic high level in the period between t_0 and t_1, the period between t_2 and t_3, and the period between t_5 and t_6. When the reset signal RESET has a logic high level, the toggle signal T_SIG may have a logic low level.

The toggle signal T_SIG may have a logic high level in the period between t_4 and t_5. When the toggle signal T_SIG has a logic high level, the input signal RE may be in the toggle state Toggling. The toggle signal T_SIG may have a logic high level at the time point t_4 but not at the time point t_3 by the first delay stage 1821 and the second delay stage 1822 included in the toggle detector 1820.

The clock signal CLK input to the D flip-flop circuit of FIG. 24 may be a result of performing a logical operation on the input signal RE and the pause signal P_SIG_R. According to an embodiment, the result of performing the logical operation on the input signal RE and the pause signal P_SIG_R may be the same as the input signal RE.

The reset signal RST input to the D flip-flop circuit of FIG. 24 may be the reset signal RESET of FIG. 25. The toggle signal T_SIG may have a logic low level in the period between t5 and t6 by the reset signal RESET.

The clock signal CLK input to the D flip-flop circuit in the toggle detector 1820 might not have a rising edge in the period between t_1 and t_2. Accordingly, the toggle signal T_SIG may have a logic low level in the period between t_1 and t_2.

A rising edge may be input to the clock signal CLK of the D flip-flop circuit at the time point t_3. However, because the toggle signal T_SIG is the result of performing the AND operation on the first delay signal DELAY_1 and the second delay signal DELAY_2, a logic low level of the toggle signal T_SIG may be maintained.

Similarly, a rising edge of the period between t_3 and t_4 may be input to the clock signal CLK of the D flip-flop circuit, but a logic low level of the toggle signal T_SIG may be maintained. A level of the toggle signal T_SIG may turn to a logic high level at the time point t_4.

A rising edge may be input to the clock signal CLK of the D flip-flop circuit at the time point t_6. However, because the toggle signal T_SIG is the result of performing the AND operation on the first delay signal DELAY_1 and the second delay signal DELAY_2, a logic low level of the toggle signal T_SIG may be maintained. That is, when the number of rising edges included in the input signal RE is less than the number of delay circuits in the toggle detector 1820, the logic low level of the toggle signal T_SIG may be maintained.

A time point at which a level of the toggle signal T_SIG turns to a logic high level may be delayed according to the number of delay circuits in the toggle detector 1820. A time point at which a level of the toggle signal T_SIG turns to a logic low level may be constant, that is, the time point t_5 by the reset signal RESET of FIG. 25. Accordingly, when the number of delay circuits in the toggle detector 1820 increases, a time period for which the logic high level of the toggle signal T_SIG is maintained may decrease.

Figure 26:
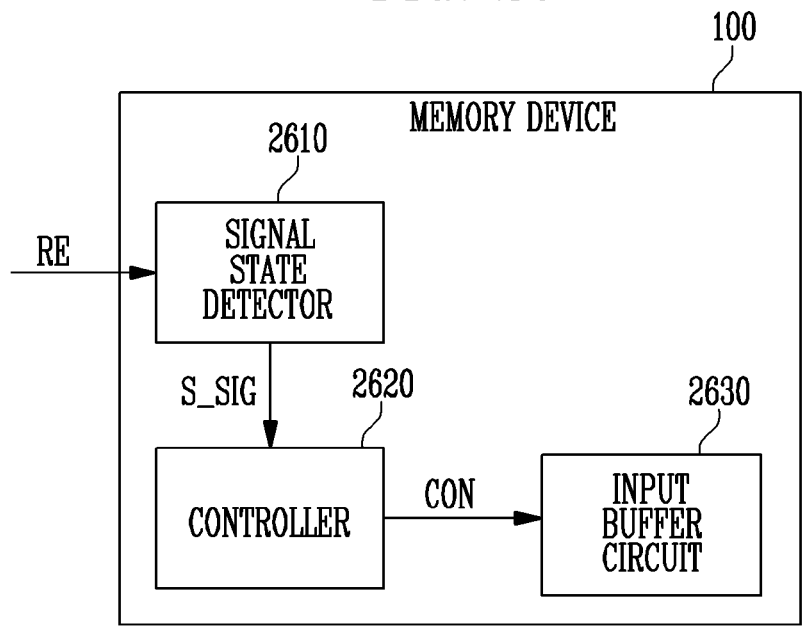
FIG. 26 is a diagram illustrating a memory device according to another embodiment of the present disclosure.

FIG. 26 is a diagram illustrating the memory device 100 according to another embodiment of the present disclosure.

Referring to FIG. 26, the memory device 100 may include a signal state detection circuit 2610, a control circuit 2620, and input buffer circuits 2630.

The signal state detection circuit 2610 may receive the input signal RE. The signal state detection circuit 2610 may generate a state signal S_SIG indicating whether the input signal RE is in the pause state Pause, the toggle Toggling, or the reset state Reset. A state of the input signal that is detected by the signal state detection circuit 2610 is not limited to the read enable signal RE.

The control circuit 2620 may generate a control signal CON controlling the input buffer circuits 2630 according to the state signal S_SIG. The input buffer circuits 2630 controlled by the control circuit 2620 may be changed according to the state signal S_SIG.

For example, the control circuit 2620 may inactivate predetermined input buffer circuits among the input buffer circuits 2630 according to the state signal S_SIG. The predetermined input buffer circuits may include input buffer circuits receiving a signal that is independent of output of data stored in the memory device 100. The control circuit 2620 may correspond to the output signal controller 1830 described with reference to FIG. 19.

The input buffer circuits 2630 may include input buffer circuits receiving a command or an address. The input buffer circuits 2630 may be disposed in a receive stage of the memory device 100. The input buffer circuits 2630 may temporarily store a signal input to the memory device 100. The input buffer circuits 2630 may adjust a magnitude of the signal input to the memory device 100 and output the adjusted signal. For example, the input buffer circuits 2630 may amplify the magnitude of the input signal and output the amplified signal.

Figure 27:
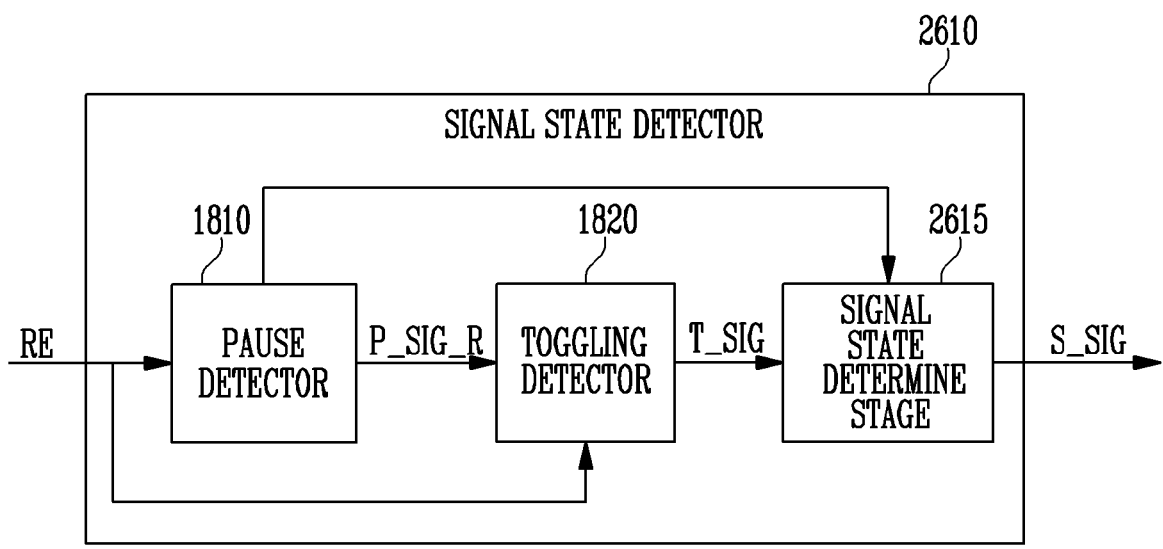
FIG. 27 is a diagram illustrating a configuration and an operation of a signal state detection circuit, such as that shown in FIG. 26.

FIG. 27 is a diagram illustrating a configuration and an operation of the signal state detection circuit 2610 shown in FIG. 26.

Referring to FIG. 27, the signal state detection circuit 2610 may include the pause detector 1810, the toggle detector 1820, and a signal state determiner 2615.

The signal state detection circuit 2610 may generate and output the state signal S_SIG based on the input signal RE. The state signal S_SIG may indicate whether the input signal RE is in the pause state Pause, the toggle state Toggling, or the reset state Reset.

According to an embodiment of the present disclosure, the signal state detection circuit 2610 may be disposed in the memory device 100. However, the position of the signal state detection circuit 2610 is not limited to be in the memory device 100. According to another embodiment of the present disclosure, the signal state detection circuit 2610 may be disposed in the storage device 50. For example, the signal state detection circuit 2610 may be disposed in the memory controller 200.

The pause detector 1810 may receive the input signal RE. The pause detector 1810 may generate the pause signal P_SIG_R indicating whether the input signal RE is in the pause state Pause. The pause signal P_SIG_R generated by the pause detector 1810 may be transferred to the toggle detector 1820 and the signal state determiner 2615. The pause detector 1810 may be included in the buffer circuit 300 or 1800 as shown in FIG. 4 or FIG. 19 or in the signal state detection circuit 2610. The pause detector 1810 may correspond to the descriptions provided with reference to FIGS. 19, 21, and 22.

The toggle detector 1820 may receive the input signal RE and the pause signal P_SIG_R. The toggle detector 1820 may generate the toggle signal T_SIG indicating the input signal RE is in the toggle state Toggling. The toggle detector 1820 may transfer the generated toggle signal T_SIG to the signal state determiner 2615.

The toggle detector 1820 may be synchronized with a clock signal generated based on the input signal RE and the pause signal P_SIG_R to generate a delay signal. The toggle detector 1820 may include at least two delay circuits that are reset according to the pause signal P_SIG_R. The delay circuits may receive the power voltage VCCI, a ground voltage, or a delay signal of another delay circuit as input data. The toggle detector 1820 may generate the toggle signal T_SIG of which time point indicating the toggle state Toggling is delayed according to the number of delay circuits.

The toggle detector 1820 may be included in the buffer circuit 1800 as shown in FIG. 19 or in the signal state detection circuit 2610. The toggle detector 1820 may correspond to the descriptions provided with reference to FIGS. 19, 23, and 24.

The signal state determiner 2615 may determine the state of the input signal RE to be one of the pause state Pause, the toggle state Toggling, and the reset state Reset based on the pause signal P_SIG_R and the toggle signal T_SIG. The signal state determiner 2615 may generate the state signal S_SIG indicating the state of the input signal RE.

For example, the signal state determiner 2615 may receive the pause signal P_SIG_R indicating that the input signal RE is in the pause state Pause and the toggle signal T_SIG indicating that the input signal RE is not in the toggle state Toggling. The signal state determiner 2615 may generate a first state signal indicating that the input signal RE is in the pause state Pause.

The first state signal may be transferred to the control circuit 2620. The control circuit 2620 may generate an output signal based on the input signal RE and control a duty cycle of the output signal according to the first state signal. The control of the duty cycle by the control circuit 2620 may correspond to the descriptions provided with reference to FIGS. 8, 9, and 10.

According to another embodiment, the signal state determiner 2615 may receive the pause signal P_SIG_R indicating that the input signal RE is not in the pause state Pause and the toggle signal T_SIG indicating that the input signal RE is in the toggle state Toggling. The signal state determiner 2615 may generate a second state signal indicating that the input signal RE is in the toggle state Toggling.

The second state signal may be transferred to the control circuit 2620. The control circuit 2620 may generate the control signal CON inactivating predetermined input buffer circuits among the input buffer circuits 2630 in response to the second state signal. The predetermined input buffer circuits may include input buffer circuits receiving a signal that is independent of output of data stored in the memory device 100.

According to another embodiment, the signal state determiner 2615 may receive the pause signal P_SIG_R indicating that the input signal RE is not in the pause state Pause and the toggle signal T_SIG indicating that the input signal RE is not in the toggle state Toggling. The signal state determiner 2615 may generate a third state signal indicating that the input signal RE is in the reset state Reset. The third state signal may be transferred to the control circuit 2620.

The control circuit 2620 may control an amount of current of the input buffer circuits 2630 in response to the first state signal, the second state signal, or the third state signal. The control circuit 2620 may minimize an amount of current consumed by the memory device 100. The control circuit 2620 may optimize an operation of the memory device 100.

Figure 28:
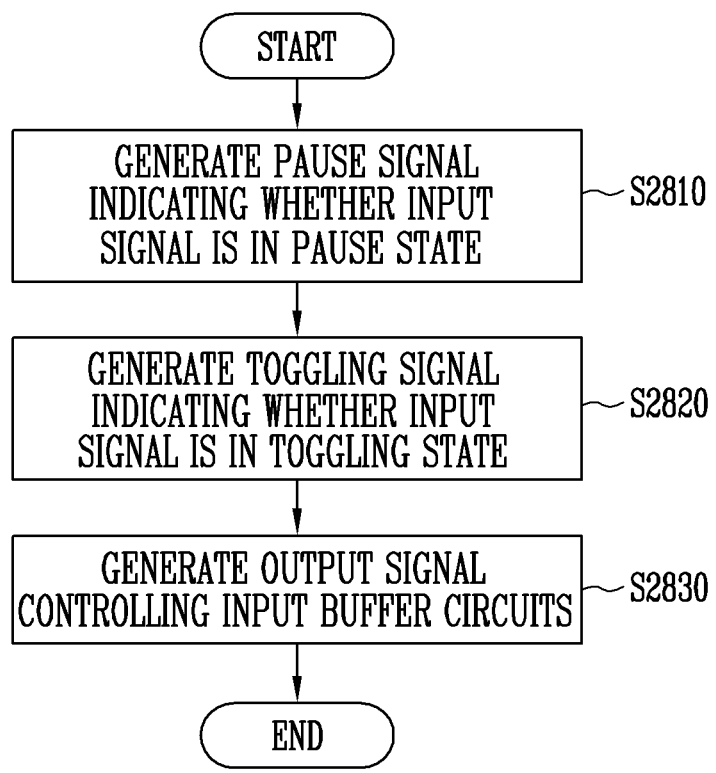
FIG. 28 is a flowchart illustrating an operation of a buffer circuit according to another embodiment of the present disclosure.

FIG. 28 is a flowchart illustrating an operation of a buffer circuit according to another embodiment of the present disclosure.

Referring to FIG. 28, the buffer circuit may generate an output signal controlling input buffer circuits according to a state of an input signal.

In operation S2810, the pause detector 1810 may receive the input signal and generate a pause signal indicating whether the input signal is in the pause state Pause. A method of operating the pause detector 1810 may correspond to the descriptions provided with reference to FIGS. 19, 21, and 22.

In operation S2820, the toggle detector 1820 may receive the input signal and the pause signal and generate a toggle signal indicating whether the input signal is in the toggle state Toggling. A method of operating the toggle detector 1820 may correspond to the descriptions provided with reference to FIGS. 19, 23, and 24.

In operation S2830, the output signal controller 1830 may generate the output signal controlling the input buffer circuits according to the toggle signal. When the input signal is in the toggle state Toggling, the output signal controller 1830 may inactivate predetermined input buffer circuits among the input buffer circuits. A method of operating the output signal controller 1830 may correspond to the descriptions provided with reference to FIGS. 18 and 19.

According to another embodiment of the present disclosure, power consumed by the input buffer circuit may be saved. When the input signal is in the toggle state Toggling, data stored in the memory device 100 may be output and input of data may be restricted. An amount of power consumption may be reduced by inactivating an input buffer circuit related to reception of a command and an address. By inactivating the unnecessary input buffer circuit, an operation of the memory device may be optimized.

According to another embodiment of the present disclosure, every state of the input signal may be detected. The pause state Pause of the input signal, the toggle state Toggling of the input signal, and the reset state Reset of the input signal may be distinguished from each other. Because all states of the input signal are distinguished, performance of a particular mode of an internal circuit may be improved.

According to embodiments of the present disclosure, a buffer circuit having improved reliability and an operating method thereof may be provided. While various embodiments of the present invention have been illustrated and described, various changes may be made to any of the disclosed embodiments, as those skilled in the art will recognize in light of the present disclosure. The present invention encompasses all such changes that fall within the scope of the claims.

What is claimed is:

1. A buffer circuit configured to generate an output signal based on an input signal, the buffer circuit comprising:
a pause detector configured to receive the input signal and to generate a pause signal which indicates whether the input signal is in a pause state;
a toggle detector configured to receive the input signal and the pause signal and to generate a toggle signal which indicates whether the input signal is in a toggle state; and
an output signal controller configured to generate the output signal which controls input buffer circuits according to the toggle signal.

2. The buffer circuit of claim 1, wherein the pause detector comprises:
a first detect stage configured to generate a first detection signal based on the input signal;
a second detect stage configured to generate a second detection signal based on the first detection signal; and
a first logical operator configured to perform a logical operation on the first detection signal and the second detection signal.

3. The buffer circuit of claim 2, wherein the first detect stage generates the first detection signal by biasing the input signal with a set pulse, which is one of an up pulse and a down pulse, and
wherein the second detect stage generates the second detection signal by biasing the first detection signal with the set pulse.

4. The buffer circuit of claim 3, wherein the first logical operator generates the pause signal which indicates that the input signal is in the pause state in response to the first detection signal or the second detection signal indicating the pause state of the input signal.

5. The buffer circuit of claim 1, wherein the toggle detector comprises:
a first delay stage configured to generate a first delay signal after the input signal and the pause signal are input and a delay elapses;
a second delay stage configured to generate a second delay signal after the input signal, the pause signal, and the first delay signal are input and the delay elapses; and
a second logical operator configured to perform a logical operation on the first delay signal and the second delay signal.

6. The buffer circuit of claim 5, wherein the first delay stage includes a first delay circuit configured to be synchronized with a clock signal generated based on the input signal and the pause signal to generate the first delay signal and to be reset according to the pause signal, and
wherein the second delay stage includes a second delay circuit configured to be synchronized with the clock signal to generate the second delay signal and to be reset according to the pause signal.

7. The buffer circuit of claim 6, wherein the first delay circuit includes a D flip-flop circuit configured to output input data of a case where the clock signal that is input has a rising edge, and
wherein the second delay circuit includes a D flip-flop circuit configured to output input data of a case where the clock signal that is input has a rising edge.

8. The buffer circuit of claim 7, wherein the first delay circuit receives a power voltage or a ground voltage as input data, and
wherein the second delay circuit receives the first delay signal as input data.

9. The buffer circuit of claim 5, wherein the second logical operator generates the toggle signal which indicates that the input signal is in the toggle state in response to the first delay signal and the second delay signal indicating the toggle state of the input signal.

10. The buffer circuit of claim 5, wherein the second logical operator generates the toggle signal which indicates that the input signal is in the toggle state after at least two rising edges from a first rising edge among a plurality of rising edges included in the toggle stage of the input signal.

11. The buffer circuit of claim 1, wherein the output signal controller generates the output signal which inactivates predetermined input buffer circuits among the input buffer circuits when the toggle signal indicates the toggle state of the input signal.

12. The buffer circuit of claim 11, wherein the output signal controller generates the output signal which activates the predetermined input buffer circuits that have been inactivated when the toggle signal does not indicate the toggle state of the input signal.

13. The buffer circuit of claim 11, wherein the output signal controller generates the output signal which minimizes an amount of current of the predetermined input buffer circuits.

14. The buffer circuit of claim 11, wherein the predetermined input buffer circuits include input buffer circuits configured to receive a command or an address.

15. The buffer circuit of claim 11, wherein the predetermined input buffer circuits include input buffer circuits configured to receive a command latch enable signal or an address latch enable signal.

16. A memory device comprising input buffer circuits configured to receive a command or an address, the memory device further comprising:
a signal state detection circuit configured to receive an input signal and to generate a state signal which indicates whether the input signal is in a pause state, a toggle state, or a reset state; and
a control circuit configured to control the input buffer circuits according to the state signal,
wherein the signal state detection circuit comprises:
a pause detector configured to receive the input signal and to generate a pause signal which indicates whether the input signal is in the pause state;
a toggle detector configured to receive the input signal and the pause signal and to generate a toggle signal which indicates whether the input signal is in the toggle state; and
a signal state determiner configured to determine a state of the input signal based on the pause signal and the toggle signal and to generate the state signal.

17. The memory device of claim 16, wherein the toggle detector includes at least two delay circuits configured to be synchronized with a clock signal generated based on the input signal and the pause signal to generate a delay signal and to be reset according to the pause signal, and
wherein the delay circuits receive a power voltage, a ground voltage, or the delay signal as input data.

18. The memory device of claim 17, wherein the toggle detector generates the toggle signal of which time point indicating the toggle state is delayed according to a number of delay circuits.

19. The memory device of claim 16, wherein the signal state determiner is further configured to:
generate a first state signal which indicates that the input signal is in the pause state in response to the pause signal which indicates the pause state of the input signal and the toggle signal which does not indicate the toggle state of the input signal;
generate a second state signal which indicates that the input signal is in the toggle state in response to the pause signal which does not indicate the pause state of the input signal and the toggle signal which indicates the toggle state of the input signal; and
generate a third state signal which indicates that the input signal is in the reset state in response to the pause signal which does not indicate the pause state of the input signal and the toggle signal which does not indicate the toggle state of the input signal.

20. The memory device of claim 19, wherein the control circuit inactivates predetermined input buffer circuits among the input buffer circuits in response to the second state signal, and
wherein the predetermined input buffer circuits are input buffer circuits that receive a signal independent of output of data stored in the memory device.

* * * * *